United States Patent [19]

Hosokawa et al.

[11] Patent Number: 5,319,647
[45] Date of Patent: Jun. 7, 1994

[54] METHOD AND APPARATUS FOR PERFORMING AUTOMATIC TEST PATTERN GENERATION

[75] Inventors: Toshinori Hosokawa, Daito; Akira Motohara, Kobe, both of Japan

[73] Assignee: Matsushita Electric Industrial Co., Ltd., Osaka, Japan

[21] Appl. No.: 551,708

[22] Filed: Jul. 11, 1990

[30] Foreign Application Priority Data

Jul. 12, 1989 [JP] Japan ................. 1-181090

[51] Int. Cl.[5] ............................ G06F 11/00
[52] U.S. Cl. .................... 371/27; 371/22.3; 371/15.1
[58] Field of Search ............ 371/27, 22.3, 17, 15.1, 371/5.1, 5.3, 28, 22.1, 23; 340/700; 364/717, 718

[56] References Cited

U.S. PATENT DOCUMENTS

| | | | |
|---|---|---|---|
| 3,713,097 | 1/1973 | Linnerooth et al. | 371/27 |
| 4,754,215 | 6/1988 | Kawai | 371/22.3 |
| 4,947,395 | 8/1990 | Bullinger et al. | 371/22.3 |
| 5,043,986 | 8/1991 | Agrawal et al. | 371/25.1 |

OTHER PUBLICATIONS

Cheng, Kwang-Ting and Agrawal, Vishwani D., "An Economical Scan Design for Sequential Logic Test Generation", The 19th Int'l Symposium on Fault-Tolerant Computing, Chicago, USA, Jun. 20-23, 1989, pp. 28-35.

Gupta, Rajesh, Gupta, Rajiv and Breuer, Melvin A., "Ballast: A Methodology For Partial Scan Design", The 19th Int'l Symposium on Fault-Tolerant Computing, Chicago, USA, Jun. 20-23, 1989, pp. 118-125.

V. D. Agrawal et a., A Complete Solution To The Partial Scan Problem, International Test Conference, 44 (1987), pp. 44-51.

Primary Examiner—Beausoliel, Jr. Robert W.
Assistant Examiner—Phung M. Chung
Attorney, Agent, or Firm—Panitch Schwarze Jacobs & Nadel

[57] ABSTRACT

An apparatus for and method of performing automatic test pattern generation for a digital circuit specified registers when the process of automatic test pattern generation for one or more faults is aborted which allow detection of circuit faults by scanning the specified registers. The scan request count of the specified registers is updated, and registers having a scan request count greater than the scan request count limit are recognized as critical registers. Automatic test pattern generation is performed while regarding the critical registers as scan registers.

26 Claims, 20 Drawing Sheets

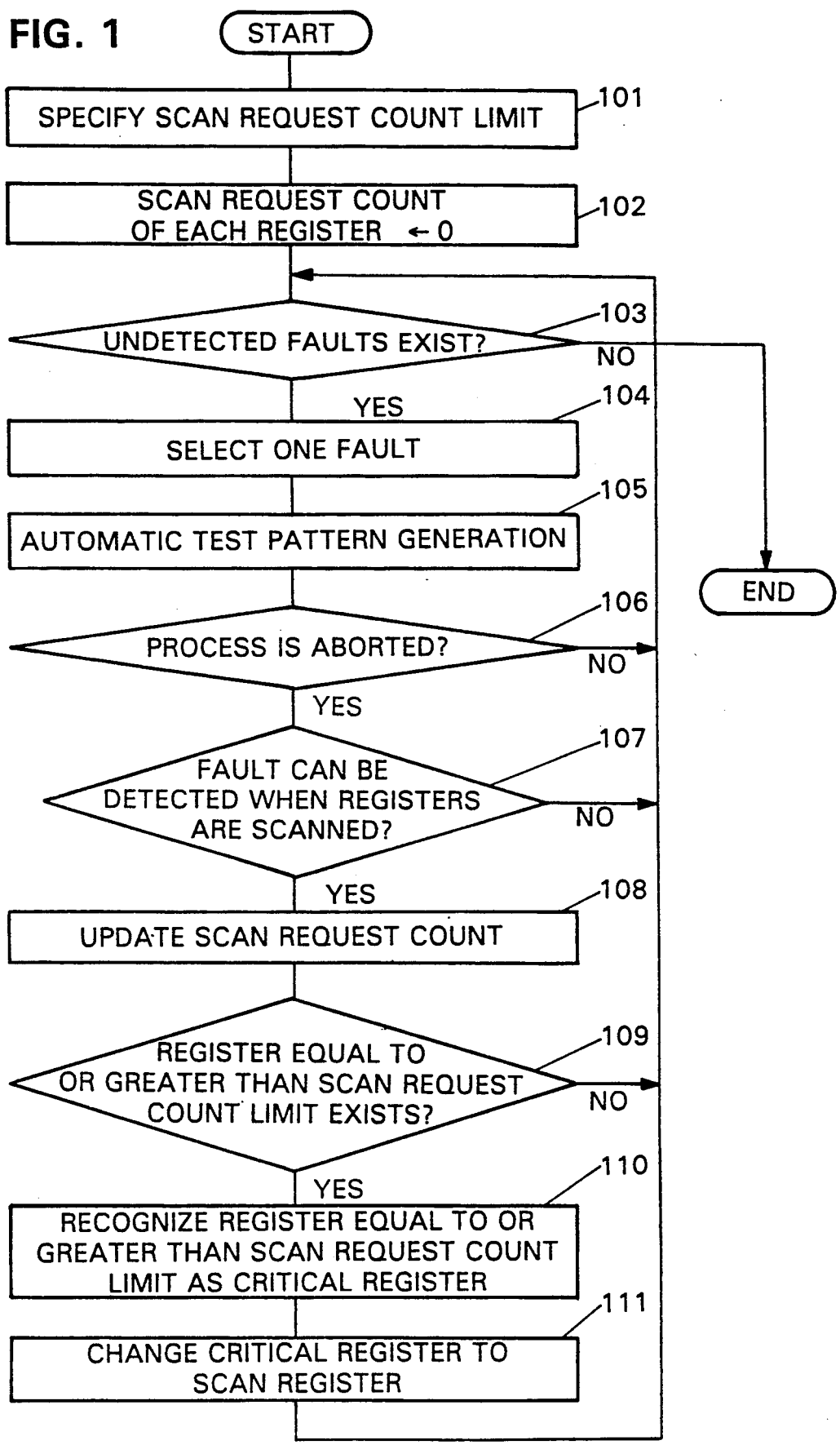

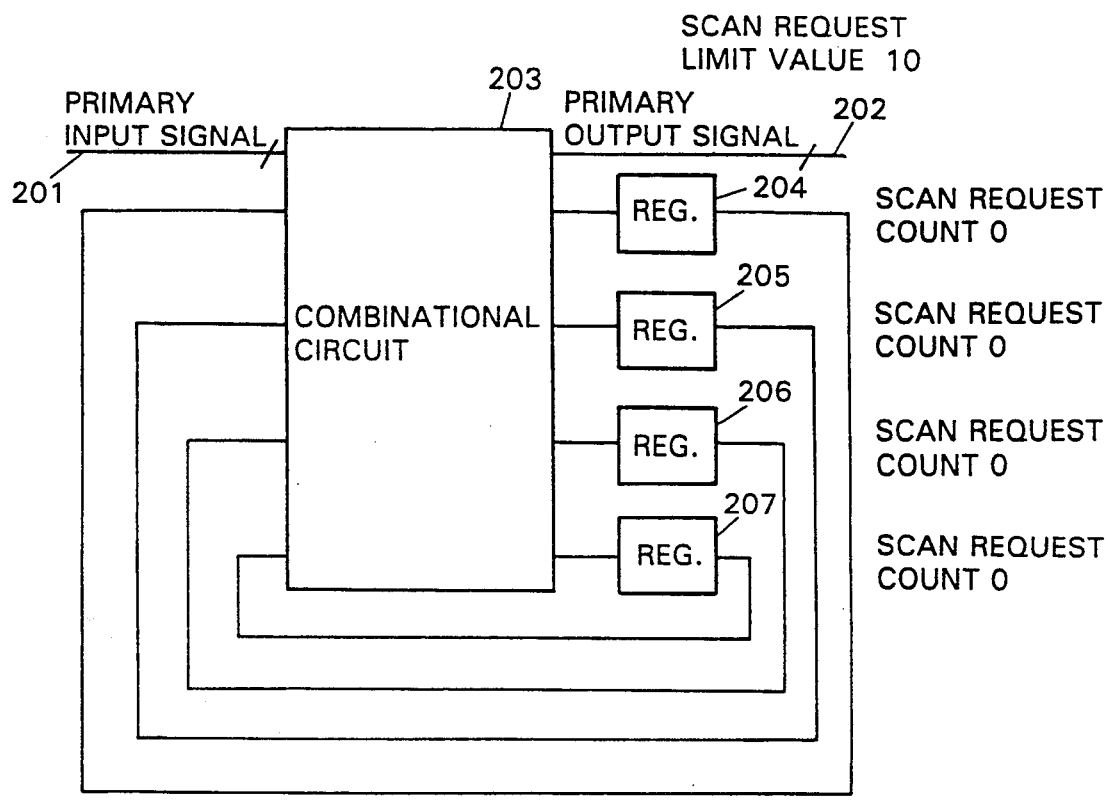
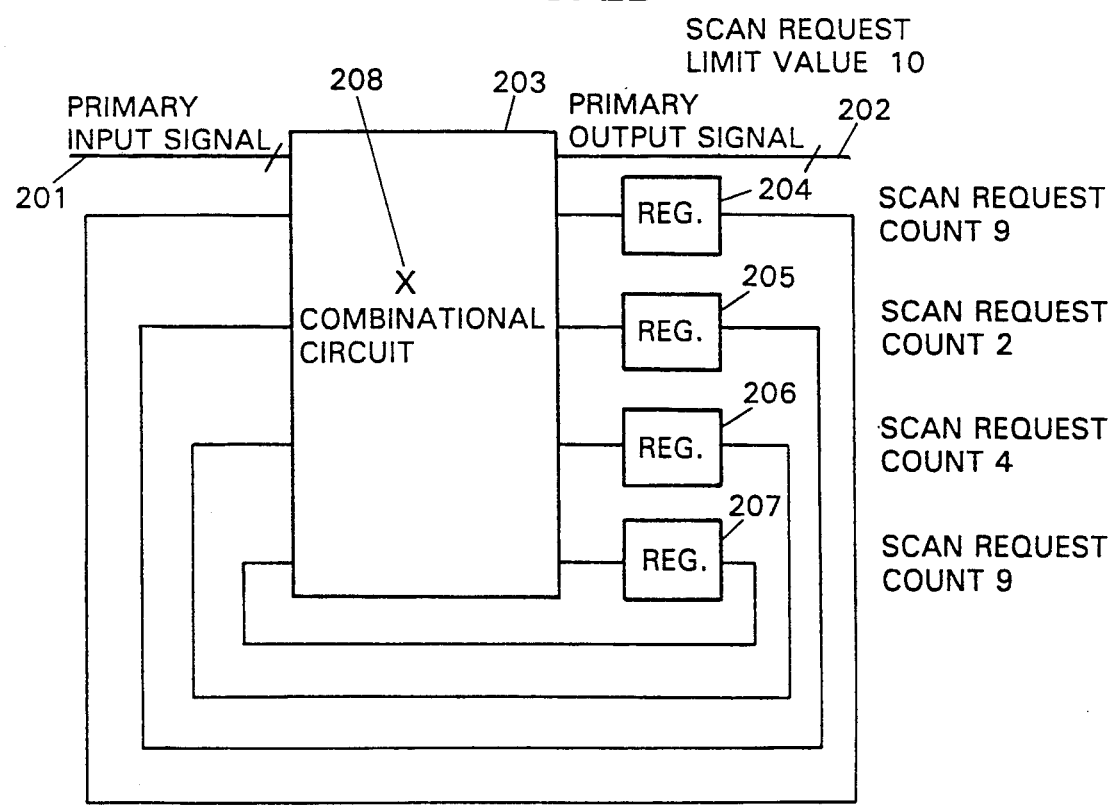

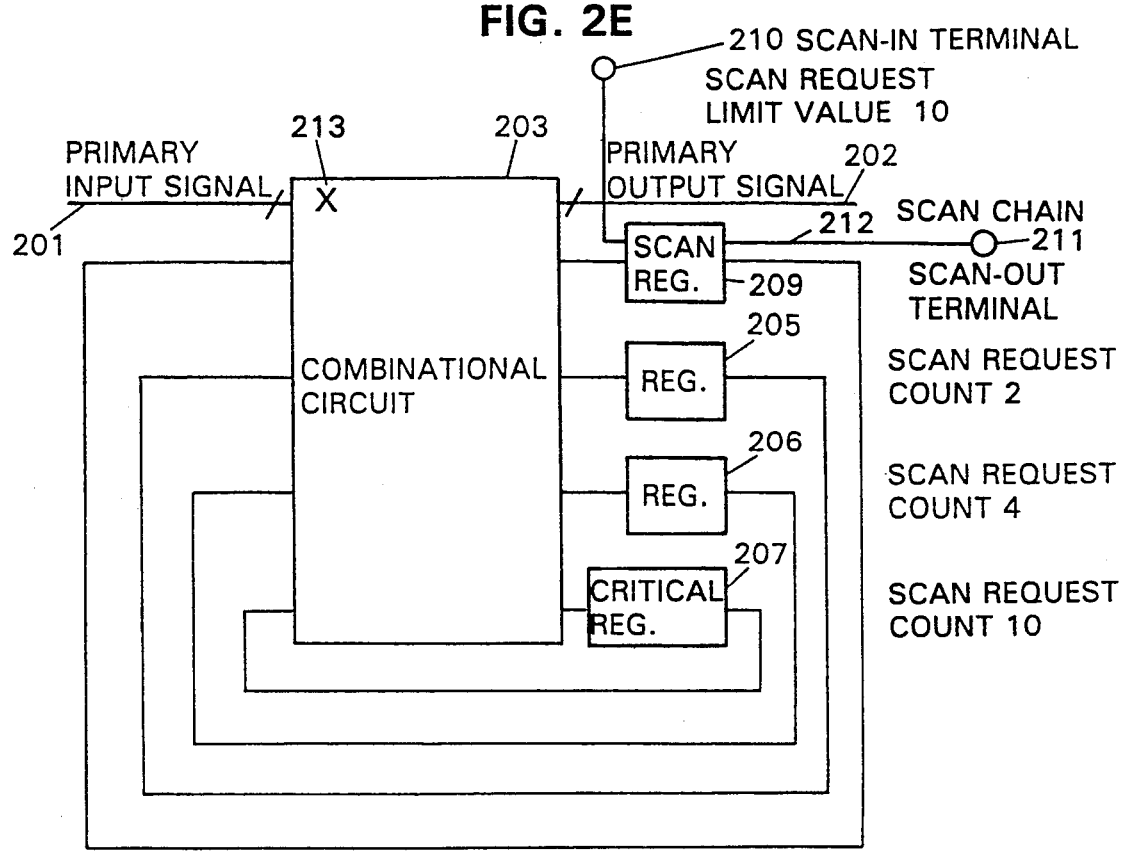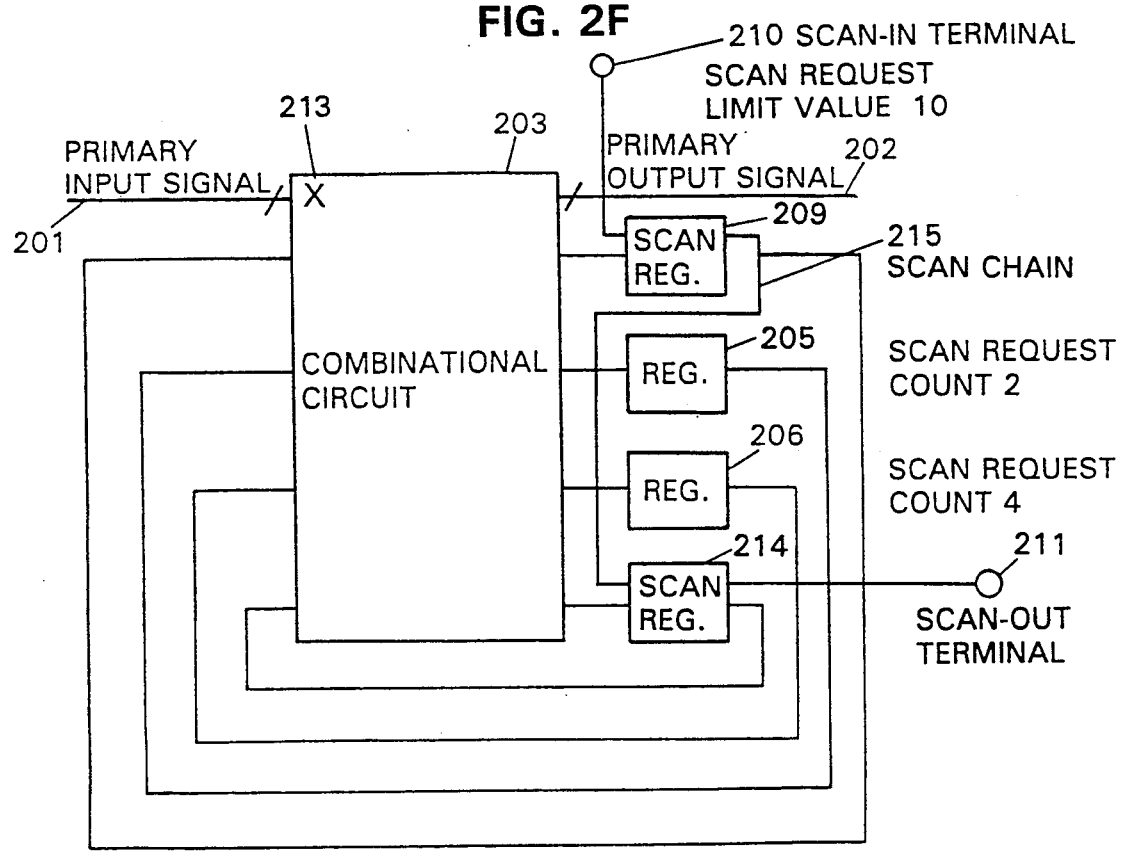

AREA IS RESTRICTED TO TWO SCAN REGISTERS OR LESS

PRIMARY INPUT SIGNAL — 401
403 — COMBINATIONAL CIRCUIT
PRIMARY OUTPUT SIGNAL — 402
404 REG. — SCAN REQUEST COUNT 0
405 REG. — SCAN REQUEST COUNT 0
406 REG. — SCAN REQUEST COUNT 0
407 REG. — SCAN REQUEST COUNT 0

TOTAL FAULT NUMBER

SPECIFIED NUMBER OF PROCESSED FAULTS

AT THIS POINT, REGISTERS ARE RECOGNIZED AS CRITICAL REGISTERS, AND CHANGED TO SCAN REGISTERS

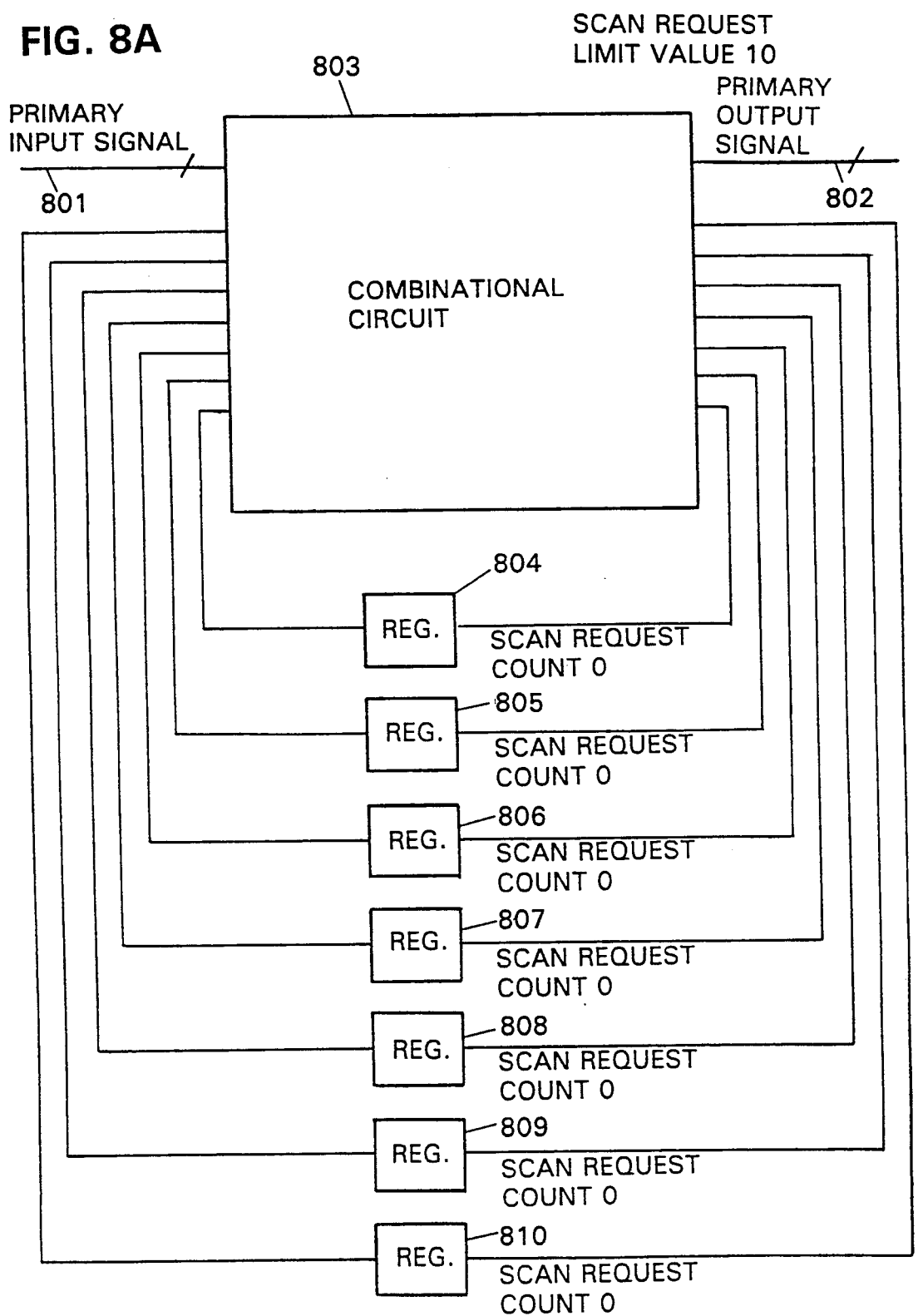

METHOD AND APPARATUS FOR PERFORMING AUTOMATIC TEST PATTERN GENERATION

BACKGROUND OF THE INVENTION

1. Field of the Invention

This invention relates to a method of performing automatic test pattern generation for digital circuits, and design for testability, and also apparatuses for the method and design.

2. Description of the Prior Art

Automatic test pattern generation for sequential circuits involves a difficult problem, and even if an automatic test pattern generation program is used, it is generally difficult to obtain test patterns for all faults within a practical CPU time period. Furthermore, there ere also some faults which cause the automatic test pattern generation to abort. In order to solve these problems, scan path technique is widely used which makes it possible to write and read states externally by switching registers to a shift register configuration in the test mode. By making all of the registers scan registers, the test of a sequential circuit can be performed in three phases of: scan-in of the register state; partial testing of the combinational circuit; and scan-out of the register state, thereby allowing automatic test pattern generation problems to be handled as those of the combinational circuit. This enables automatic test pattern generation to be greatly simplified.

However, the structure for making all of the registers scan registers greatly increases the hardware overhead. Therefore, partial scan structure is used wherein only some of the registers have scan structure. In the partial scan, there is a high degree of freedom in selecting which registers are to be scan structure, and there have been proposed several methods of selecting registers which should be changed to scan registers.

Techniques of partial scan design are taught in "A Complete Solution to the Partial Scan Problem" (Int. Test Conf., pp. 44-51, 1987) and the references cited therein.

When considered from the standpoint of scan register selection, the prior art techniques can be generally classified into two categories shown in FIGS. 9A and 9B. In the method shown in FIG. 9A, the causes for low fault coverage are investigated after performing automatic test pattern generation, and then questioned registers are changed to scan registers. In the method shown in FIG. 9B, before performing automatic test pattern generation, registers which will likely present problems in test pattern generation are estimated based on the circuit topology, and then these registers are changed to scan registers.

The former method requires great amounts of the CPU time and memory capacity. The later method does not guarantee that registers which present problems in test pattern generation will actually be scanned, so that it is difficult to obtain high fault coverage with small area overhead.

SUMMARY OF THE INVENTION

The method of this invention, which overcomes the above-discussed and numerous other disadvantages and deficiencies of the prior art, performs automatic test pattern generation for a circuit including registers, and comprises the steps of: when aborting the process of automatic test pattern generation for one or more faults, specifying one or more registers which allow detection of said fault by scanning said specified registers; setting a scan request count limit; counting a scan request count for each of said registers; updating the scan request count of said specified registers; and recognizing one or more registers the scan request count of which is greater than said scan request count limit, as critical registers.

One or more registers the scan request count of which is greater than specified number may be recognized as critical registers.

One or more registers the scan request count of which has a percentage of total fault number which is greater than specified value may be recognized as critical registers.

When a specified number of faults have been processed, a specified number of registers with higher scan request count may be recognized as critical registers.

When a specified percentage of the ratio of faults to total faults have been processed, specified number of registers with higher scan request count may be recognized as critical registers.

When specified fault coverage has not been achieved when specified number of faults have been processed, specified number of registers with higher scan request count may be recognized as critical registers.

When specified fault coverage has not been achieved when specified percentage of faults to total faults have been processed, specified number of registers with higher scan request count may be recognized as critical registers.

When a specified number of faults have been processed, registers the scan request count of which are greater than a specified value may be recognized as critical registers.

When a specified percentage of the ratio of faults to total faults have been processed, registers the scan request count of which is greater than specified value may be recognized as critical registers.

When a specified number of faults have been processed, registers having a scan request count greater than the specified percentage of the number of faults which have been processed may be recognized as critical registers.

When a specified percentage of faults to total faults have been processed, registers having a scan request count the greater than the specified percentage of the number of faults which have been processed may be recognized as critical registers.

Automatic lest pattern generation may be performed while regarding said critical registers as scan registers.

The method of design for testability for a circuit including registers, according to the invention, comprises the steps of: when aborting the process of automatic test pattern generation for one or more faults, specifying one or more registers which allow detection of said fault by scanning said specified registers; setting a scan request count limit; counting a scan request count for each of said registers; updating the scan request count of said specified registers; recognizing one or more registers the scan request count of which is greater than said scan request count limit, as critical registers; and at each time when one of said registers is recognized by said register recognition means, changing said recognized register to a scan register one after another, thereby reconstructing the circuit.

The apparatus for performing automatic test pattern generation for a circuit including registers, according to the invention, comprises: critical recognition means for, when aborting the process of automatic test pattern generation for one or more faults, specifying one or more registers which allow detection of said fault by scanning said specified registers; count set means for setting a scan request count limit; count means for counting a scan request count for each of said registers; count update means for updating the scan request count of said specified registers; and register recognition means for recognizing one or more registers the scan request count of which is greater than said scan request count limit, as critical registers.

Said register recognition means may recognize one or more registers the scan request count of which is greater then specified number, as critical registers.

Said register recognition means may recognize one or more registers the scan request count of which has a percentage of total fault number which is greater than specified value, as critical registers.

When specified number of faults have been processed, said register recognition means may recognize specified number of registers with higher scan request count, as critical registers.

When specified percentage of faults to total faults have been processed, said register recognition means may recognize specified number of registers with higher scan request count, as critical registers.

When specified fault coverage has not been achieved when specified number of faults have been processed, said register recognition means may recognize specified number of registers with higher scan request count, as critical registers.

When specified fault coverage has not been achieved when specified percentage of faults to total faults have been processed, said register recognition means may recognize specified number of registers with higher scan request count, as critical registers.

When specified number of faults have been processed, said register recognition means may recognize registers the scan request count of which is greater than specified value, as critical registers.

When specified percentage of faults to total faults have been processed, said register recognition means may recognize registers the scan request count of which is greater than specified value, as critical registers.

When specified number of faults have been processed, said register recognition means may recognize registers the scan request count of which is greater than specified percentage of the number of faults which have been processed, as critical registers.

When specified percentage of faults to total faults have been processed, said register recognition means may recognize registers the scan request count of which is greater than specified percentage of the number of faults which have been processed, as critical registers.

Said apparatus may further comprises test pattern generation means for performing automatic test pattern generation while regarding said critical registers as scan registers.

The apparatus for design for testability for a circuit including registers, according to the invention, comprises: register assignment means for, when aborting the process of automatic test pattern generation for one or more faults, specifying one or more registers which allow detection of said fault by scanning said specified registers; count set means for setting a scan request count limit; count means for counting a scan request count for each of said registers; count update means for updating the scan request count of said specified registers; register recognition means for recognizing one or more registers the scan request count of which is greater than said scan request count limit, as critical registers; and circuit reconstruction means for, at each time when one of said registers is recognized by said register recognition means, changing said recognized register to a scan register one after another, thereby reconstructing the circuit.

Thus, the invention described herein makes possible the objectives of:

(1) providing a method of performing automatic test pattern generation which can reduce both the CPU time and the chip area;

(2) providing a method of performing automatic test pattern generation which can attain higher fault coverage;

(3) providing design for testability which can reduce both the CPU time and the chip area;

(4) providing design for testability which can attain higher fault coverage;

(5) providing an apparatus for performing automatic test pattern generation which can reduce both the CPU time and the chip area;

(6) providing an apparatus for performing automatic test pattern generation which can attain higher fault coverage;

(7) providing an apparatus for design for testability which can reduce both the CPU time and the chip area; and (8) providing an apparatus for design for testability which can attain higher fault coverage.

BRIEF DESCRIPTION OF THE DRAWINGS

This invention may be better understood and its numerous objects and advantages will become apparent to those skilled in the art by reference to the accompanying drawings as follows:

FIG. 1 is a flowchart of a first embodiment of the invention.

FIG. 2A shows the state of the circuit in one embodiment of the invention before test pattern generation is performed.

FIG. 2B shows the state of the circuit before designing for testability and immediately before processing a fault.

FIG. 2E shows the state of the circuit immediately after another fault is subjected to an abort process.

FIG. 2F shows the state of the circuit immediately after the registers recognized as critical registers in the abort process of the other fault are changed to scan registers.

FIG. 8A shows the state of the circuit in a further embodiment of the invention before test pattern, generation is performed.

DESCRIPTION OF THE PREFERRED EMBODIMENTS

Example 1

Figure 2C:
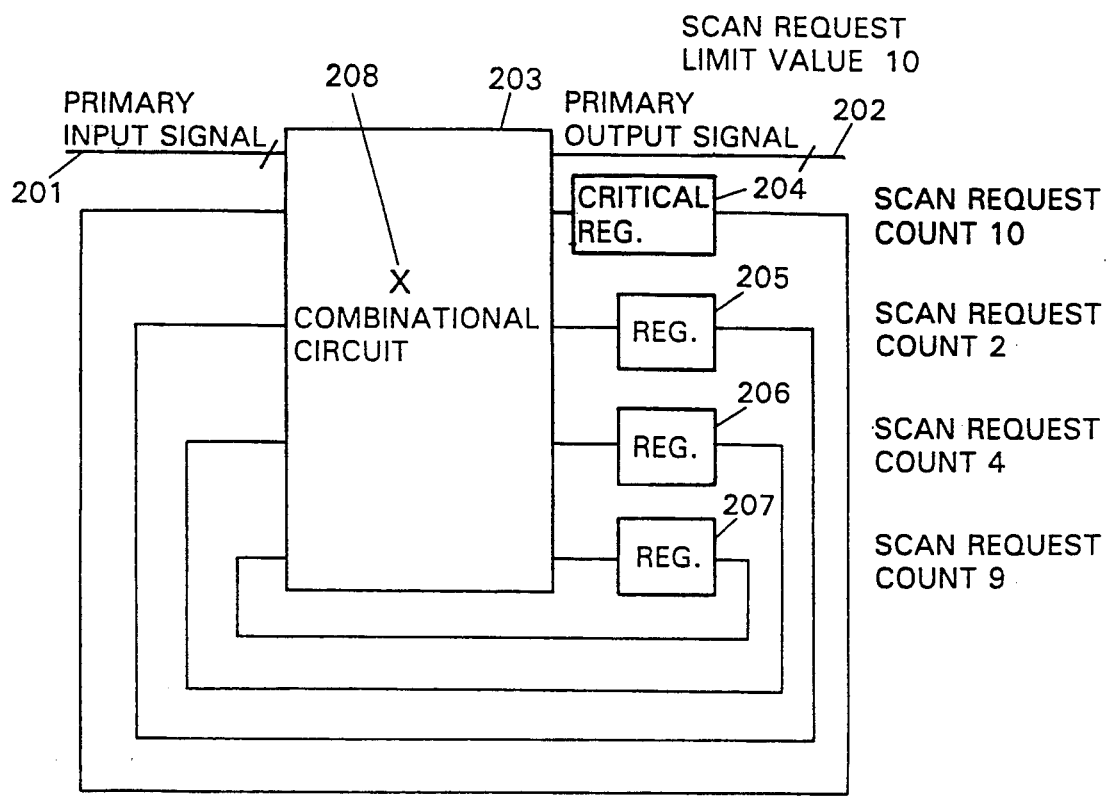
FIG. 2C shows the state of the circuit immediately after the fault is subjected to an abort process.

FIG. 1 is a flowchart of a first embodiment of the automatic test pattern generation method and design for testability according to the invention. In the first embodiment, registers in which the scan request count exceeds specified limit for the scan request count are recognized as critical registers, and these critical registers are changed to scan registers.

First, in step 101, the scan request count limit which is the parameter required for recognizing critical registers is specified for each register. Registers the contents of which exceed this scan request count limit ire recognized as critical registers. Next, in step 102, the scan request count of each register is initialized to 0. In step 103, the digital circuit to be tested is examined to determine whether or not it has an undetected fault(s), and if there is no undetected fault, then automatic test pattern generation is terminated.

If undetected faults do exist, then the process proceeds to step 104 where one of the undetected faults is selected. In step 105, thereafter, a test pattern which propagates the effect of the fault selected in step 104 to the primary output pin of the circuit is generated using an algorithm based on a known circuit topology. In step 106, it is determined whether or not test pattern generation has been aborted based on the results of test pattern generation obtained in step 105. In this embodiment, automatic test pattern generation is stopped, and the process aborted for faults, when any one of the following parameters set by the user is exceeded: the limit on the CPU time which is required to detect one fault; the limit on the length of the test pattern generated to detect one fault; and the limit on the number of times of repeating the reassign of the value sent into the primary output pin. If test pattern generation has not been aborted, the process returns from step 106 to step 103, and the next fault is processed.

When automatic test pattern generation is aborted, the process proceeds to step 107 where the results obtained in step 105 are used to judge whether it is possible or not to detect the fault when the registers are scanned under the condition that the automatic test pattern generation is aborted. If it has been judged that the fault cannot be detected even when the registers are scanned, then the process returns to step 103 to process the next fault.

If the fault can be detected when the registers are scanned, the process proceeds to step 108 where the scan request count is updated for each of the registers for which the fault can be detected. In step 109, then, it is determined if there are any registers the scan request count of which exceeds the limit. If there is no register the scan request count of which exceeds this limit, then the process returns to step 103 to process the next fault.

If registers the scan request count of which does exceed the limit exist, then the process proceeds to step 110 where those registers whose scan request count exceeds the limit are recognized as critical registers. After these critical registers are changed to scan registers in step 111, the process returns to step 103 where the next fault is processed on the modified circuit.

FIGS. 2A to 2F illustrate the automatic test pattern generation method of this embodiment. In FIGS. 2A to 2F, 201 indicates primary input signal lines, 202 primary output signal lines, 203 a combinational circuit portion of the circuit, 204–207 registers, 208 a fault, 209 and 214 scan registers, 210 a scan-in terminal, 211 a scan-out terminal, 212 a scan chain, 213 another fault, and 215 a new scan chain.

Figure 2D:
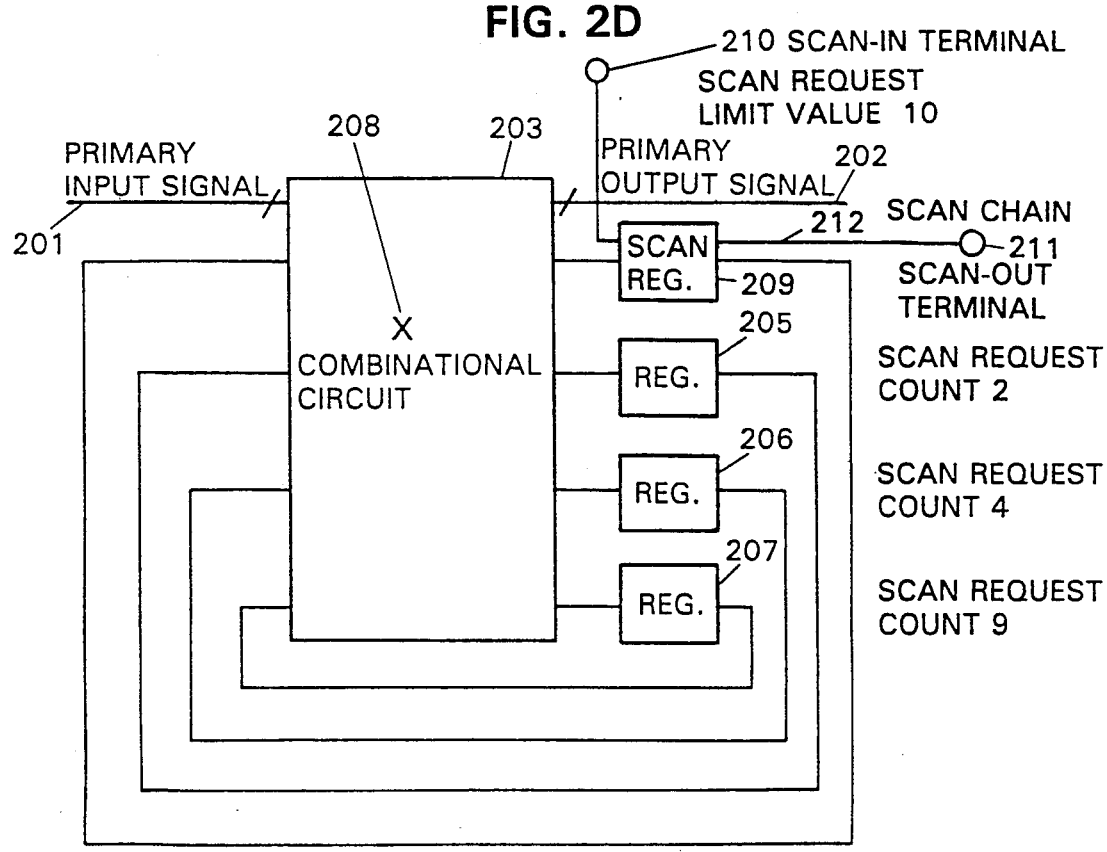
FIG. 2D shows the state of the circuit immediately after the registers recognized as critical registers in the abort process of the fault are changed to scan registers.

The automatic test pattern generation method and design method for testability shown in FIG. 1 are applied to the circuit shown in FIG. 2A. in this state, the observable point is the primary output signal line 202, and the controllable point is the primary input signal 201. For the registers 204–207, the scan request count limit, which is the parameter for recognizing a register as a critical register, is 10. That is, registers with a scan request count of 10 or more are recognized as critical registers. The scan request counts for each of the registers 204–207 initialized to 0 as shown in FIG. 2A. Then, as shown in FIG. 2B, the scan request counts for each of the registers are 9 for the register 204, 2 for the register 205, 4 for the register 206, and 9 for the register 207. Next, in step 104, the undetected fault 208 is selected, and in step 105, test pattern generation of the fault 208 is attempted, after which it aborts. As a result of the checks performed in steps 106 and 107, it is found that the fault 208 can be detected by replacing the register 204 with a scan register. In step 106, as shown in FIG. 2C, the scan request count of the register 204 is updated to 10. The register 204 is recognized as a critical register (steps 109 and 110). Then, in step 111, the register 204 is changed to the scan register 209, and the scan-in terminal 210 and scan-out terminal 211 are added to form a scan path such as that indicated by the scan chain 212 as shown in FIG. 2D. In FIG. 2D, the observable points are the primary output signal line 202 and the scan register 209, and the controllable points are the primary input signal line 201 and the scan register 209, so that, as compared to the state of FIG. 2A, testability and observability are improved, resulting in easier automatic test pattern generation.

Thereafter, returning to step 104, the other undetected fault 213 is selected, and test pattern generation of the fault 213 is attempted, and then it aborts. As a result of the cheeks which are performed again in steps 106 and 107, it is found that the fault 213 can be detected by replacing the register 207 with a scan register. As shown in FIG. 2E, the scan request count of the register 207 is updated to 10 in step 108. In steps 109 and 110, the register 207 is recognized as a critical register. In step 111, as shown in FIG. 2F, the critical register 207 is changed to the scan register 214, and a scan chain 215 is formed and the scan-out terminal 211 is connected to the scan register 214 thereby establishing a new scan path. In FIG. 2F, the observable points are the primary output signal line 202 and the scan registers 209 and 214, and the controllable points are the primary input signal line 201 and the scan registers 209 and 214, so that, as compared to the state of FIG. 2D, testability and observability are more improved, thus further simplifying automatic test pattern generation.

As described above, according to the embodiment, the registers which make automatic test pattern generation extremely difficult are preferentially changed to scan registers, and therefore subsequent test pattern generation is greatly simplified. Further, by employing a means for replacing critical registers with scan registers immediately after they are recognized as critical registers, testability is achieved with a smaller hardware overhead. In this embodiment, registers the scan request count of which exceeds the specified count in automatic test pattern generation are recognized as critical registers. Alternatively, the same effect can be obtained by recognizing registers which have specified ratio of the seen request count to the total number of faults, as critical registers.

Example 2

Figure 3:
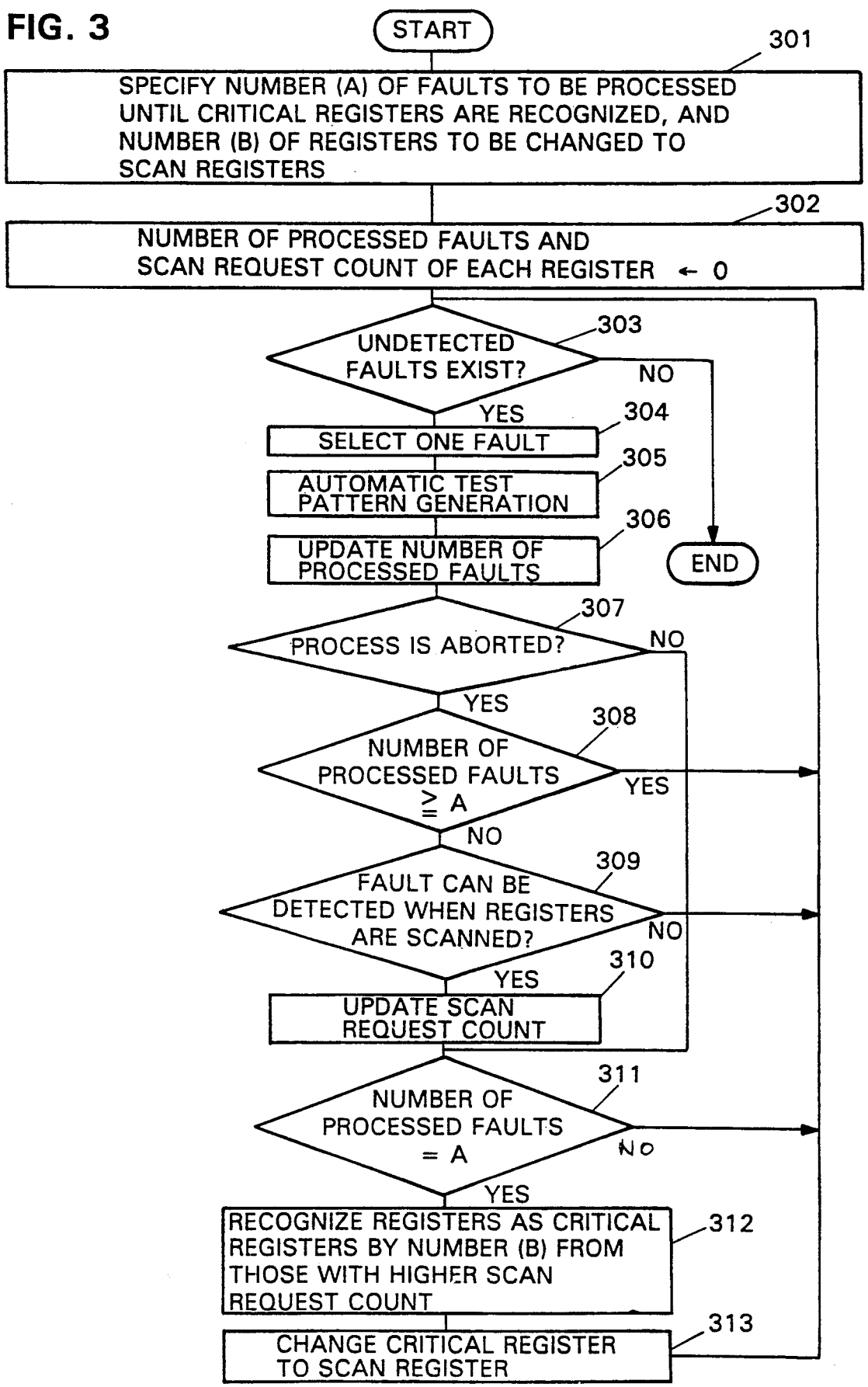
FIG. 3 is a flowchart of a second embodiment of the invention.

FIG. 3 is a flowchart of a second embodiment of the automatic test pattern generation method and design for testability according to the invention. In the second embodiment, a fixed number of registers are recognized as critical registers beginning from the register with the largest number of scan requests only after specified number of faults have been processed, and then these critical registers are changed to scan registers.

First, in step 301, the number (represented by "A") of faults to be processed until critical registers are recognized, and the number (represented by "B") of registers to be changed to scan registers are specified as parameters. In step 302, the scan request count of each register and the number of processed faults are initialized to 0. Next, in step 303, the digital circuit to be tested is checked for undetected faults, and if there is no undetected fault, automatic test pattern generation is terminated.

If undetected faults do exist, the process proceeds to step 304 where one of the undetected faults is selected. In step 305, a test pattern which propagates the effect of the fault selected in step 304 to the primary output pin of the circuit is generated in the circuit to be tested, and then in step 306, the number of faults processed up to that point is updated. In step 307, it is checked whether or not the automatic test pattern generation process has been aborted based on the results of automatic test pattern generation in step 305. If it has not been aborted, the process proceeds to step 311. This embodiment stops and aborts automatic test pattern generation for a certain fault in the same manner as in the first embodiment.

When automatic test pattern generation is aborted, the process proceeds to step 308 where it is checked whether the number of faults that have been processed equals or exceeds the number to be processed until critical registers are recognized as specified in step 301. If the number of processed faults exceeds the number of faults to be processed until critical registers are recognized as specified in step 301, the process returns from step 308 to step 303, and the next fault is processed.

If the number of processed faults is less than the fault number A (specified in step 301) to be processed until critical registers are recognized. Then, the process proceeds to step 309 where it is determined whether or not the faults can be detected by scanning the registers in the state in which automatic test pattern generation processing is aborted. If the faults cannot be detected by scanning the registers, then the process returns to step 303.

If the faults can be detected by scanning the registers, then the process proceeds to step 310 where the scan request count for each of the registers which allow detection of the faults by scanning is updated. In step 311, then, it is checked whether or not the number of faults processed up to this point is equal to the number A of faults to be processed until critical registers are recognized. If the number of faults processed up to this point is not equal to the number A, then the process proceeds to step 303 and the next fault is processed.

If the number of faults processed up to this point is equal to the number A of faults to be processed until critical registers are recognized, then the process proceeds to step 312 where the number of registers to be changed to scan registers as specified in step 301 are recognized as critical registers beginning from the register with the highest scan request count. Next, in step 313, the critical registers are changed to scan registers, after which the process proceeds to step 303 where the next fault is processed on the modified circuit. From this point, registers are not changed to scan registers.

FIGS. 4A to 4D illustrate the automatic test pattern generation method of this embodiment. In FIGS. 4A to 4D, 401 indicates primary input signal lines, 402 primary output signal lines, 403 a combinational circuit portion of the circuit, 404–407 registers, 408 and 409 scan registers, 410 a scan-in terminal, 411 a scan-out terminal, and 412 a scan chain.

Figure 4A:
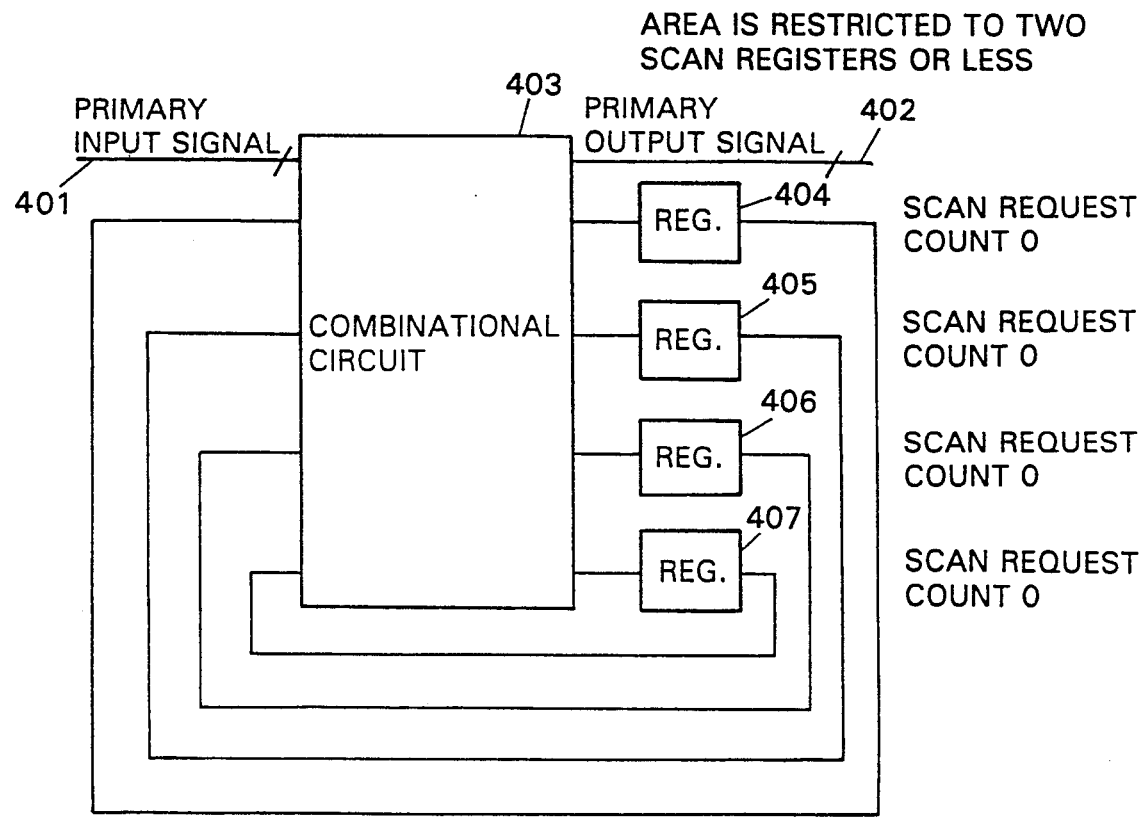
FIG. 4A shows the state of the circuit in another embodiment of the invention before test pattern generation is performed.
Figure 4B:
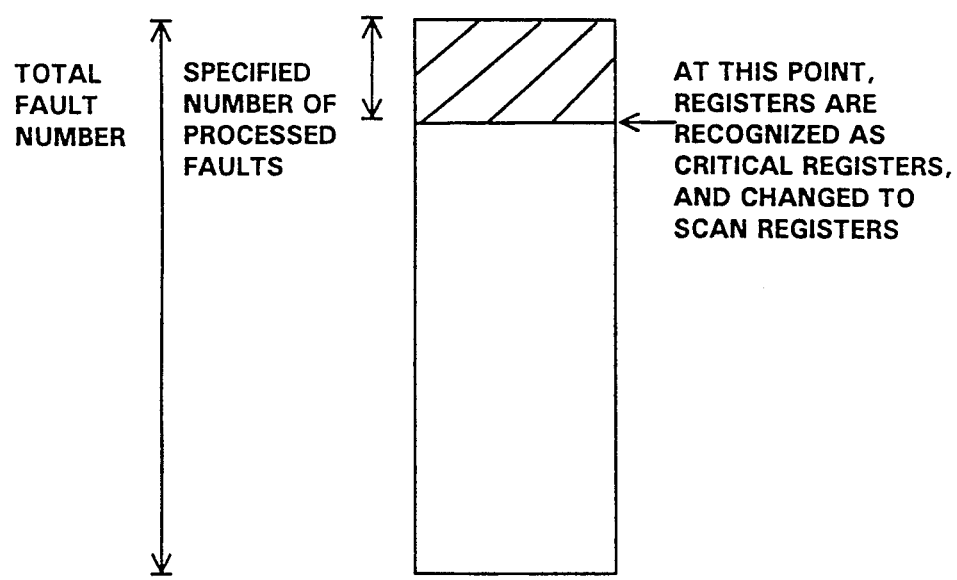
FIG. 4B is a diagram illustrating the timing of recognizing registers as critical registers.
Figure 4C:
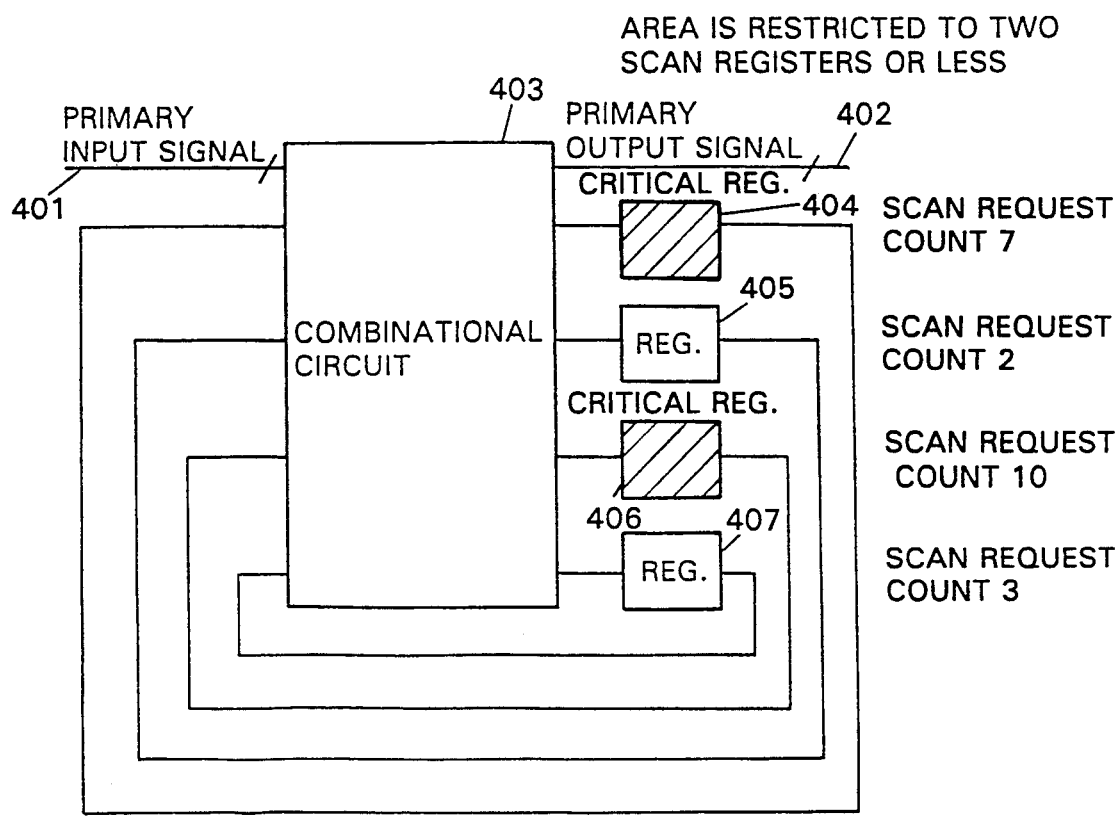
FIG. 4C shows the state of the circuit immediately after the registers is recognized as critical registers.
Figure 4D:
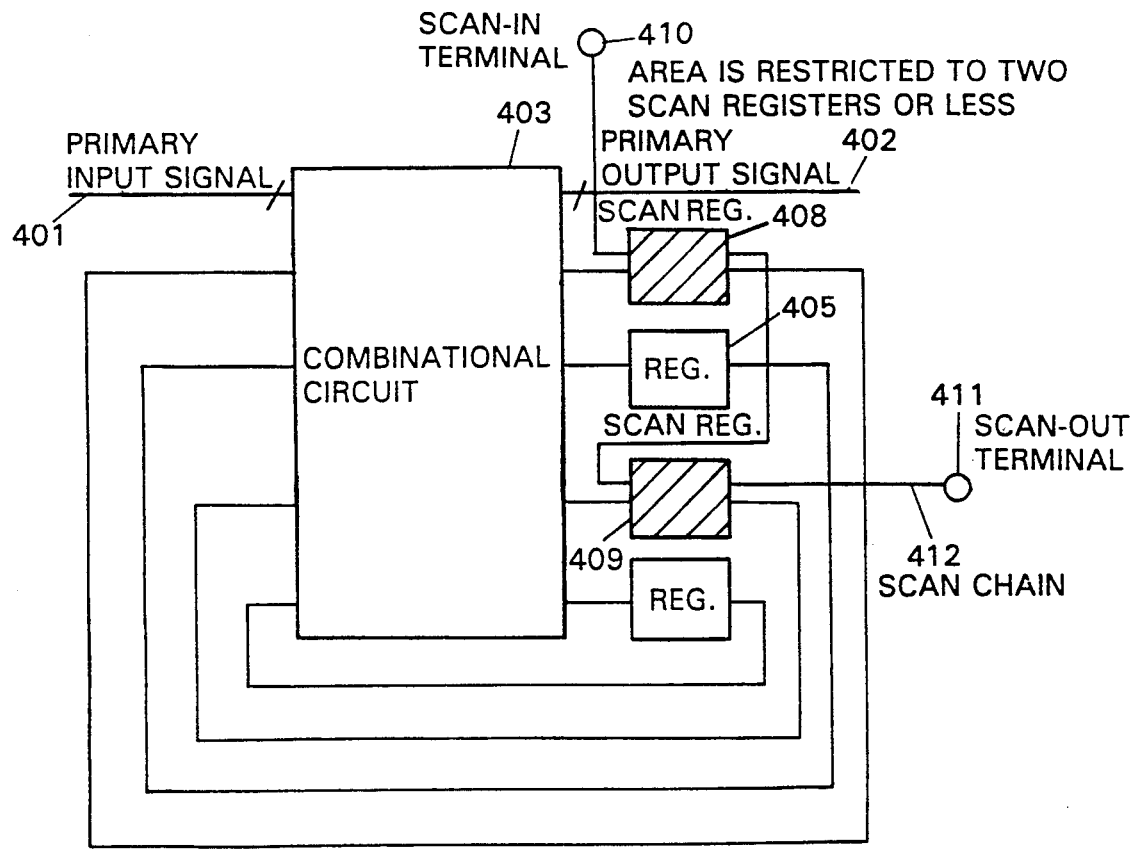
FIG. 4D shows the state of the circuit after the registers recognized as critical registers are changed to scan registers.

The automatic test pattern generation method and design method for testability shown in FIG. 3 are applied to the circuit shown in FIG. 4A. In this circuit, however, the area is restricted so that only two registers can be changed to scan registers. In this state, the observable points are the primary output signal lines 402, and the controllable points are the primary input signal lines 401. The automatic -.est pattern generation in FIG. 3 is applied to the circuit shown in FIG. 4A until the number of the processed faults reaches that shown in FIG. 4B (i.e., the number A), resulting in that the state of the circuit becomes as shown in FIG. 4C. Since the number of processed faults equals the specified number A, the process advances from step 311 to step 312 in which registers are recognized as critical registers in such a manner that two registers are recognized as critical registers beginning with the register with the highest scan request count. More specifically, since the scan request counts for the registers are 7 for the register 404, 2 for the register 405, 10 for the register 406 and 3 for the register 407, the registers 404 and 406 are recognized as critical registers (in FIG. 4C, the registers 404 and 406 are hatched). Then, in step 313, as shown in FIG. 4 (D), the register 404 is changed to the scan register 408, the register 406 is changed to the scan register 409, and the scan-in terminal 410 and scan-out terminal 411 are formed to establish a scan path indicated by the scan chain 412. In FIG. 4D, the controllable points are the primary input signal line 401 and the scan registers 408 and 409, and the observable points are primary output signal line 402 and the scan registers 408 and 409. Compared in the state shown in FIG. 4A, automatic test pattern generation is clearly easier in the state shown in FIG. 4D. Automatic test pattern generation is then performed on the circuit shown in FIG. 4D for the remaining faults.

According to the second embodiment, automatic test pattern generation can be performed within the constraints of a restricted area. When critical registers recognized as a result of the process of a specified number of faults are effective for the entire circuit, fault coverage can be increased with a small area overhead. Furthermore, by employing a means for replacing critical registers with scan registers immediately after they are recognized as critical registers, testability is achieved with a smaller hardware overhead.

In this embodiment, the specified number of registers are recognized as critical registers beginning from the register with the highest scan request count after the specified number of faults have been processed during automatic test pattern generation. Alternatively, the same effect can be obtained by recognizing a specified number of registers as critical registers beginning from the register with the highest scan request count after specified percentage of all the faults has been processed.

Example 3

Figure 5:
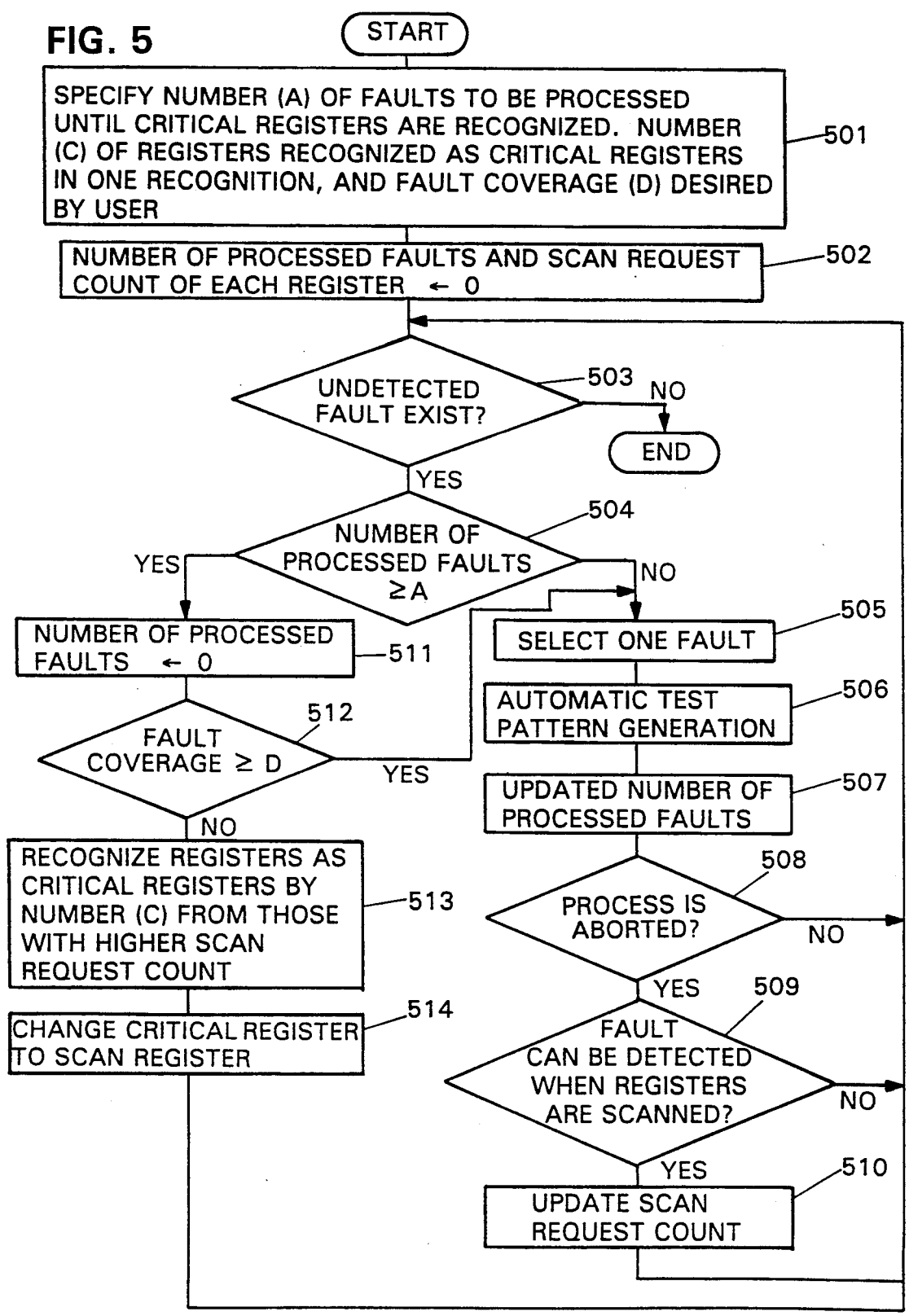
FIG. 5 is a flowchart of a third embodiment of the invention.

FIG. 5 is a flowchart of a third embodiment of the automatic test pattern generation method and design method for testability according to the invention. In the third embodiment, if specified fault coverage is not achieved when the specified number of faults have been processed, then the specified number of registers are recognized as critical registers beginning from the register with the largest number of scan requests and these critical registers are changed to scan registers.

First, in step 501, the number A of faults to be processed until critical registers are recognized, the number C of registers to be recognized as critical registers each time critical registers are recognized, and the fault coverage D desired by the user are specified. Next, in step 502, the number of processed faults and the scan request count number for each register are initialized to 0. In step 503, the digital circuit to be tested is checked for undetected faults. If there is no undetected fault, then automatic test pattern generation is terminated.

When undetected faults do exist, the process proceeds to step 504 where it is determined whether or not the number of processed faults is equal to or greater than the fault number A specified in step 501. If the number of processed faults is not greater than the fault number A, then the process proceeds to step 505 where one of the faults is selected. Then, in step 506, a test pattern which propagates the effect of the fault selected in step 505 to the primary output pin is generated in the circuit being tested. In step 507, the number of processed faults is updated, and then in step 508 it is determined whether or not the automatic test pattern generation process has been aborted based on the results of automatic test pattern generation in step 506. If it has not been aborted, then the process returns to step 503 where the next fault is processed. As in the first embodiment, the automatic test pattern generation process of a certain fault is stopped and aborted.

If automatic test pattern generation is aborted, the process proceeds to step 509 where it is determined if the fault can be detected by scanning the registers under the condition that automatic test pattern generation is aborted. If the fault cannot be detected even when the registers are scanned, then the process returns to step 503 to process the next fault.

If the fault can be detected by scanning the registers, then the process proceeds to step 510 where the scan request count is updated for each of the registers capable of detecting the fault when scanned. Then, the process returns to step 503 to process the next fault.

If the number of processed faults is equal to or greater than the fault number a specified in step 501, the process proceeds from step 504 to step 511 where the number of processed faults is initialized to 0. Then in step 512, it is determined whether or not the fault coverage is equal to or greater than the value D specified in step 501. If the coverage is greater then the value D, then the process proceeds to stop 505 to process the next fault.

If the coverage is less than the value D, then the process proceeds to step 513 where the number C of registers to be recognized as critical registers each time critical registers are recognized as critical registers beginning f rom the register with the highest scan request count. After the critical registers are changed to scan registers in step 514, then the process returns to step 503 where the next fault is processed on the modified circuit.

FIGS. 6A to 6F illustrates the automatic test pattern generation method and design method for testability of this embodiment. In FIGS. 6A to 6F, 601 indicates primary input signal lines, 602 primary output signal lines, 603 a combinational circuit portion of the circuit, 604–610 registers, 611, 612, 616 and 617 scan registers, 613 a scan-in terminal, 614 a scan-out terminal, 615 a first scan chain, and 618 a second scan chain.

Figure 6A:
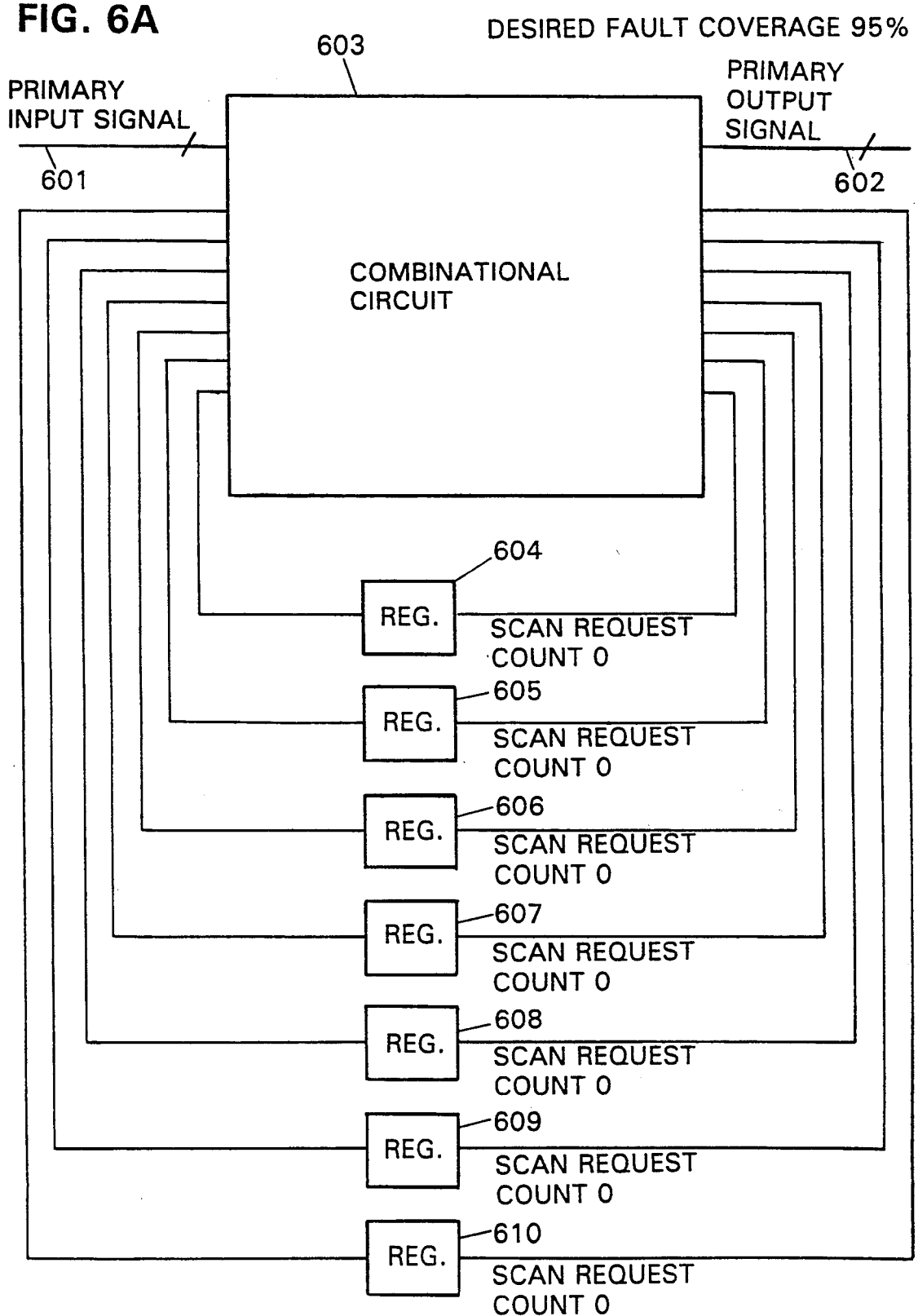
FIG. 6A shows the state of the circuit in a further embodiment before performing automatic test pattern generation.

The automatic test pattern generation method and design method for testability shown in the flowchart of FIG. 5 are applied to the circuit shown in FIG. 6A. In step 501, the desired fault coverage (the value D) is specified as 95%, and two registers are specified for replacement with scan registers each time (i.e., the value C is set to 2). The controllable points in the circuit in FIG. 6A are the primary input signal lines 601, and the observable points are the primary output signal lines 602. As a result of performing the automatic test pattern generation shown in the flowchart of FIG. 5 for faults on the circuit of FIG. 6A up to the first replacement with scan registers shown in FIG. 6B, the state of the circuit becomes as shown in FIG. 6C. At this time, the fault coverage is 20%, and the scan request counts of each of the registers are 8 for the register 604, 2 for the register 605, 1 for the register 606, 5 for the register 607, 0 for the register 608, 4 for the register 609, and 3 for the register 610.

In step 504, since the number of processed faults up to this point is the same as the number A of faults to be processed as specified in step 501, the number of processed faults is cleared to 0 (step 511). Since the coverage up to this point is 20%, it is judged that it is not greater than the specified value D (95%) in step 512, so the two registers to be changed to scan registers (the number of replaced registers is as specified in step 501) are recognized as critical registers in step 513 beginning from the register with the highest scan request count. That is, the registers 604 and 607 are recognized as critical registers.

Then in step 514, the registers 604 and 607 are changed to the scan registers 611 and 612, respectively. The scan-in terminal 613 and scan-out terminal 614 are used to form a scan path as indicated by the first scan chain 615 shown in FIG. 6D. At this point, the controllable points are the primary input signal lines 601 and the scan registers 611 and 612, and the observable points are the primary output signal lines 602 and the scan registers 611 and 612, so automatic test pattern generation is easier than in the state in FIG. 6A.

Figure 6B:
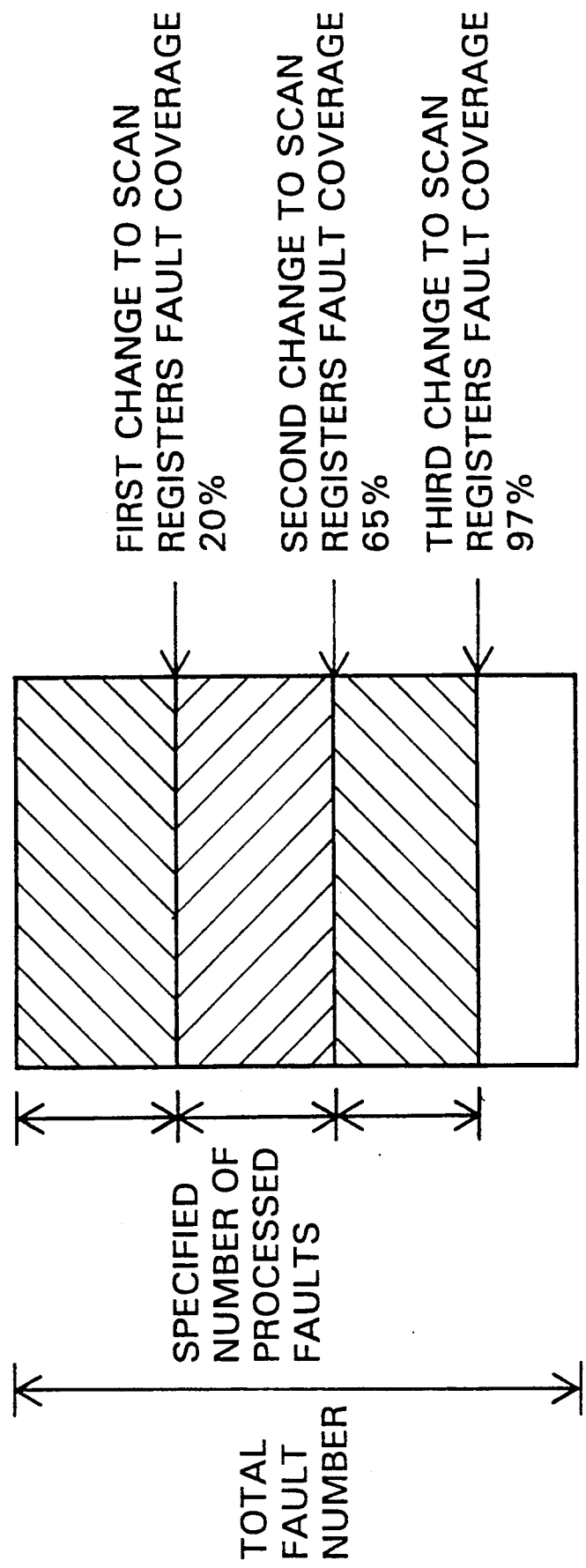
FIG. 6B is a diagram showing the timing whereby critical registers are recognized.
Figure 6C:
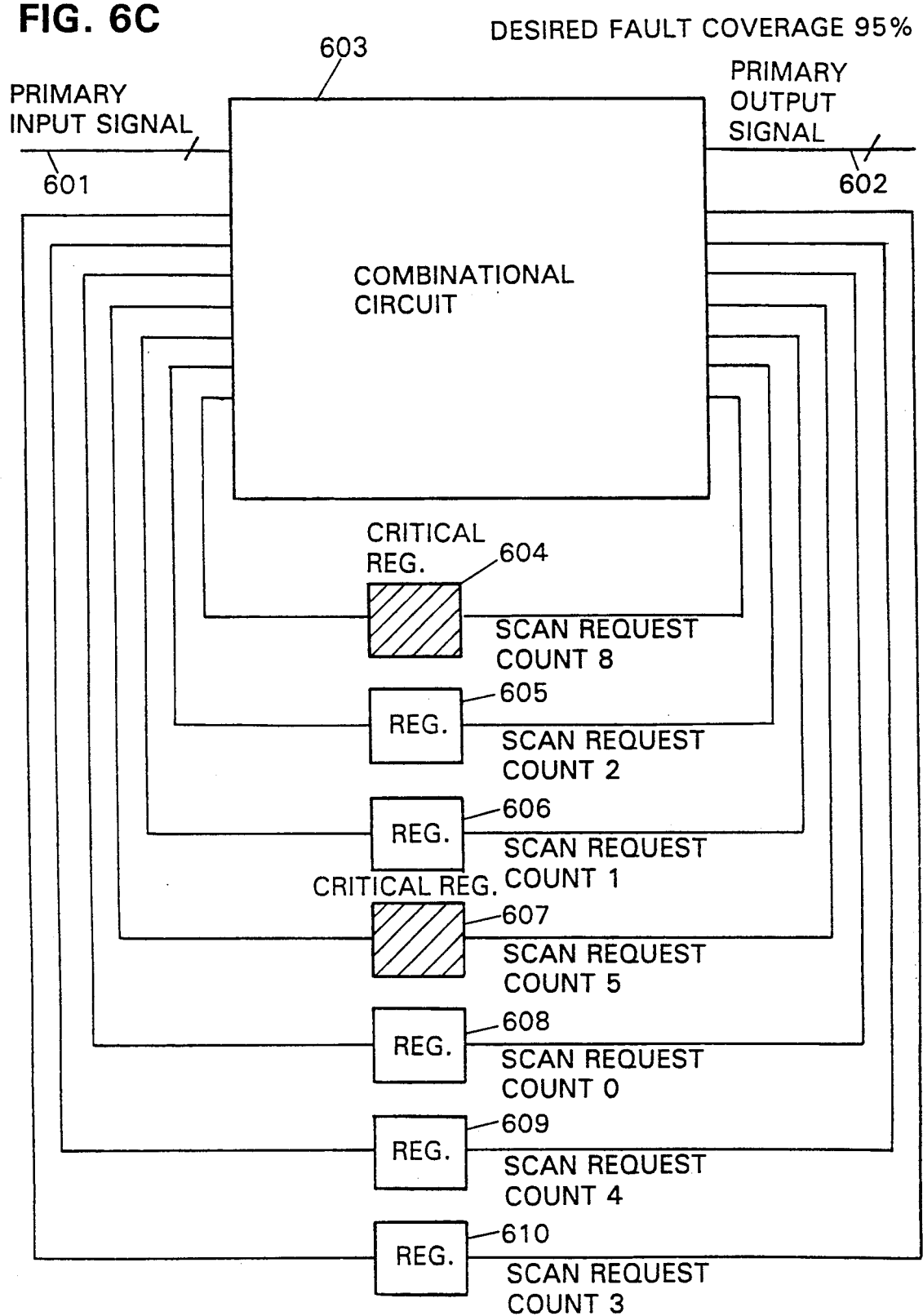
FIG. 6C shows the state of the circuit after critical registers are recognized at the first time.
Figure 6D:
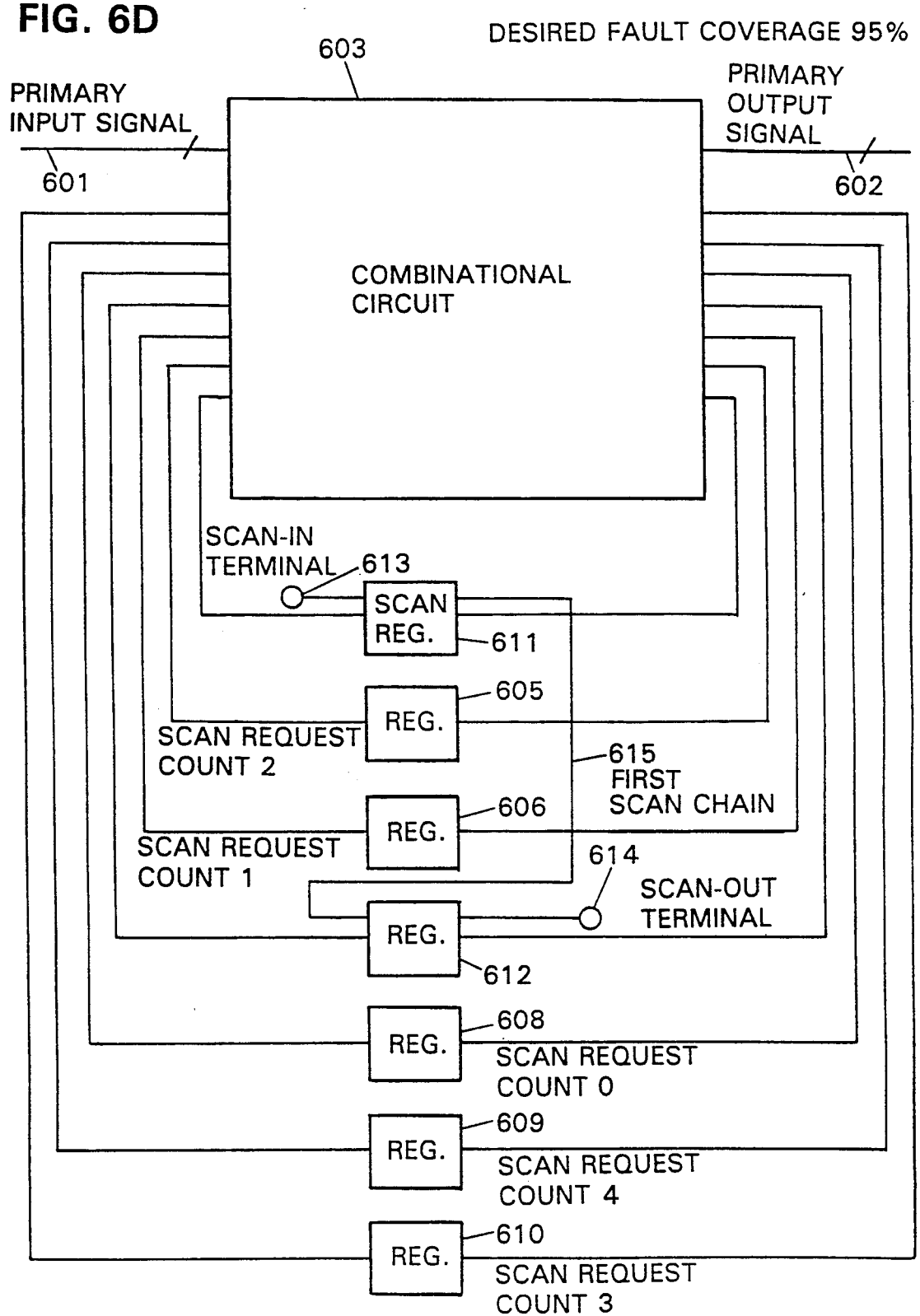
FIG. 6D shows the state of the circuit after the critical registers are changed to scan registers.
Figure 6E:
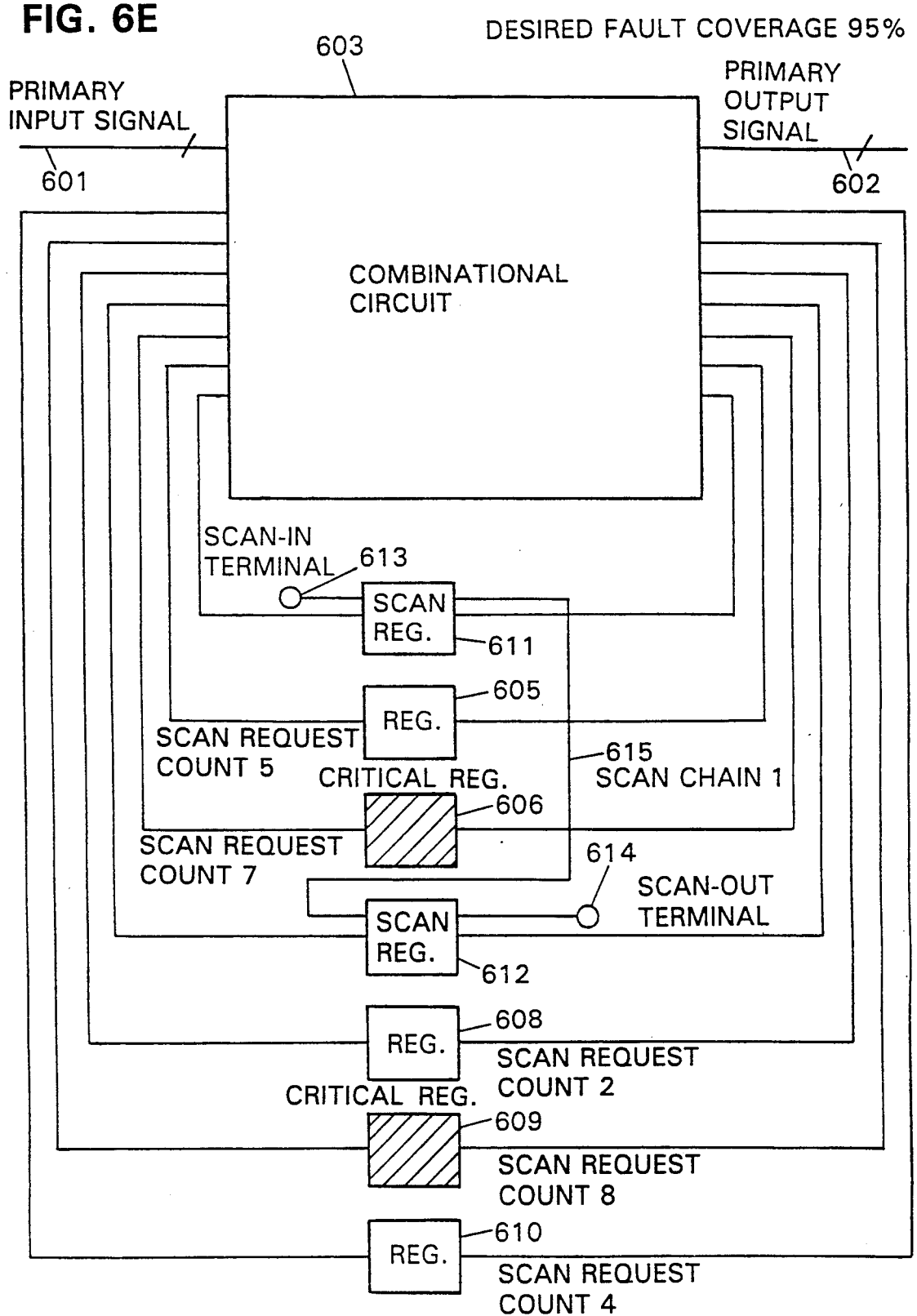
FIG. 6E shows the state of the circuit after critical registers are recognized at the second time.
Figure 6F:
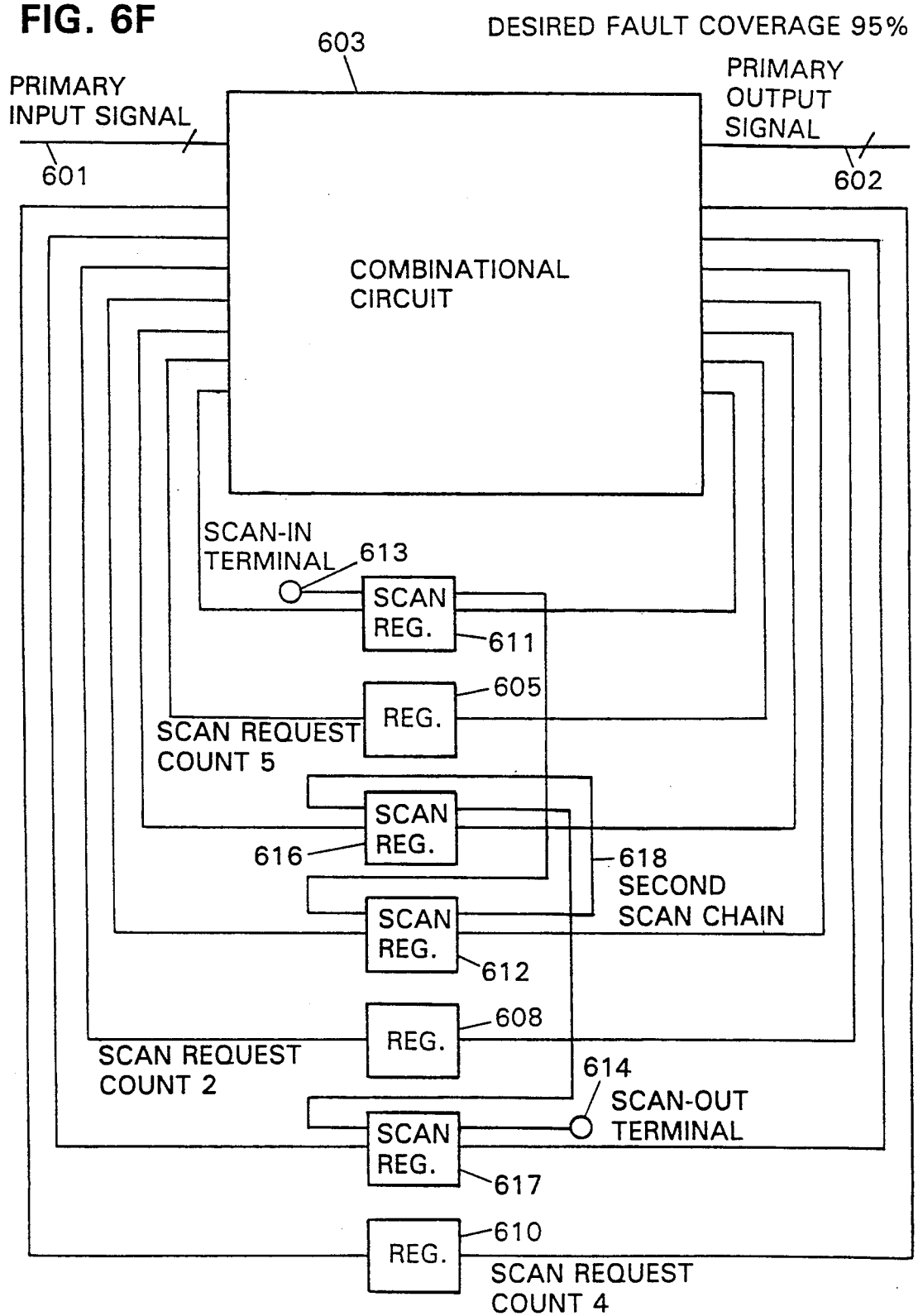
FIG. 6F shows the state of the circuit after the critical registers are changed to scan registers and a scan chain is added.

Following the above, the automatic test pattern generation shown in the flowchart of FIG. 5 is performed for faults on the circuit shown in FIG. 6D up to the second replacement with scan registers, and as a result, the state of the circuit becomes as shown in FIG. 6E. At this point, the coverage is 65%, and the scan request counts for each of the registers are 5 for the register 605, 7 for the register 606, 2 for the register 608, 8 for the register 609, and 4 for the register 610. In step 504, the number of processed faults equals the number A of faults to be processed, and the number of processed faults is cleared to 0 (step 511). Since the current fault coverage is 65%, it is judged in step 512 not to be greater than the value D of 95% specified in step 501, and therefore the two registers to be changed to scan registers (the number of replaced registers is as specified in step 501) are recognized as critical registers in step 513 beginning from the register with the highest scan request count. That is, the registers 606 and 609 are recognized as critical registers. Then in step 514, the register 606 is changed to the scan register 616 and the register 609 with the scan register 617, and the scan-in terminal 613 and scan-out terminal 614 are used to form a scan path as indicated by the second scan chain 618 as shown in FIG. 6F. At this point, the controllable points are the primary input signal lines 601 and the scan registers 611, 612, 616 and 617, and the observable points are the primary output signal lines 602 and the scan registers 611, 612, 616 and 617, so automatic test pattern generation is easier than in the state shown in FIG. 6D.

Following the above, the automatic test pattern generation shown in the flowchart of FIG. 5 is performed for faults on the circuit shown in FIG. 6F up to the third replacement with scan registers shown in FIG. 6B. At this point, the current fault coverage is 97%. in step 504, the number of processed faults is equal to the number A of faults to be processed (as specified in step 501), so the number of processed faults is cleared to 0 in step 511. Since the fault coverage is 97%, it is judged in step 512 to be greater than the value D of 95% specified in step 501, resulting in that no more registers are changed to scan registers.

As described above, according to this embodiment, the fault coverage desired by the user can be guaranteed, and testability can be achieved with a smaller area overhead. Furthermore, by employing a means for replacing critical registers with scan registers immediately after they are recognized as critical registers, improved testability with smaller hardware overhead is achieved.

In this embodiment, if the specified fault coverage is not achieved after the specified number of faults have been processed in automatic test pattern generation, then the specified number of registers are recognized as critical registers beginning from the register with the highest scan request count. Alternatively, the same effect can be achieved by recognizing the specified number of registers as critical registers beginning from the register with the highest scan request count if the specified fault coverage is not obtained after specified percentage of all the faults have been processed.

Example 4

Figure 7:
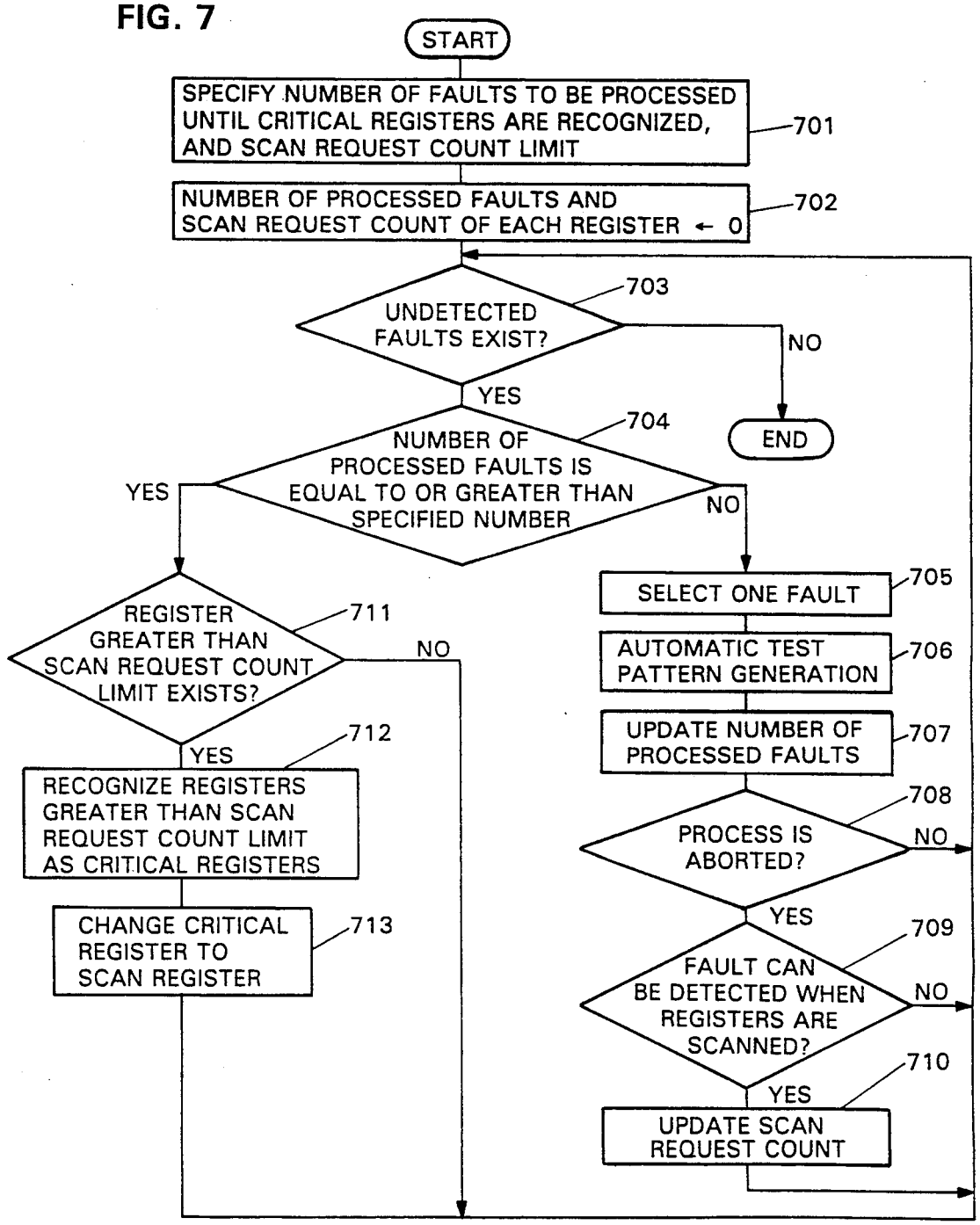
FIG. 7 is a flowchart of a fourth embodiment of the invention.

FIG. 7 is a flowchart of a fourth embodiment of the automatic test pattern generation method and design method for testability according to the invention. In the fourth embodiment, when the scan request count exceeds a scan request count limit after a specified number of faults to be processed has been processed, only those registers the scan request count of which exceeds the limit are recognized as critical registers, and these critical registers are changed to scan registers.

First, in step 701, the number of faults to be processed until critical registers are recognized, and the scan request count limit are specified as parameters. Next, the number of processed faults, and the scan request count for each register are initialized to 0 (step 702). in step 703, the digital circuit to be tested is checked for undetected faults. If there is no undetected fault, then automatic test pattern generation is terminated.

If undetected faults do exist, then the process proceeds to step 704 where it is determined if the current number of processed faults equals or exceeds the number of faults specified in step 701. If the number of processed faults is less than the number of faults specified in step 701, then the process proceeds to step 705 where one of the faults is selected. In step 706, a test pattern which propagates the effect of the fault selected in step 705 to the primary output pin of the circuit is generated in the circuit to be tested. In step 707, the number of processed faults is updated. Then in step 708, it is determined whether or not test pattern generation has been aborted based on the results of test pattern generation obtained in step 706. If it has not been aborted, the process returns to step 703, and processes the next fault. In this embodiment, automatic test pattern generation is stopped and aborted for certain faults in the same manner as in the first embodiment.

When automatic test pattern generation is aborted, the process proceeds from step 708 to step 709 where it is determined whether or not the fault can be detected by scanning the registers in the state in which automatic test pattern generation is aborted. If the fault cannot detected even when the registers are scanned, then the process returns to step 703 to process the next fault.

If the fault can be detected when the registers are scanned, the process advances to step 710 where the scan request count is updated for each of the registers which permit detection of the fault when scanned, and then the process returns to step 703 to process the next fault. If the fault cannot be detected even when scanned, then the process returns to step 703 to process the next fault.

If the current number of processed faults is equal to or greater than the number specified in step 701, then the process proceeds to step 711 where it is checked if registers exist the scan request count of which exceeds the scan request count limit. If there is no register the scan request count of which equals or exceeds this limit, then the process proceeds to step 703 where the next fault is processed.

If there are registers the scan request count of which equals or exceeds the scan request count limit, then the process proceeds to step 712 where registers the scan request count of which equals or exceeds the limit are recognized as critical registers. After the critical registers are changed to scan registers in step 713, the process returns to step 703 to process the next fault on the modified circuit.

FIGS. 8A to 8D illustrate the automatic test pattern generation method of this embodiment. In FIGS. 8A to 8D, 801 indicates primary input signal lines, 802 primary output signal lines, 803 a combinational circuit portion of the circuit, 804-810 registers, 811-813 scan registers, 814 a scan-in terminal, 815 a scan-out terminal, and 816 a scan chain.

Figure 8B:
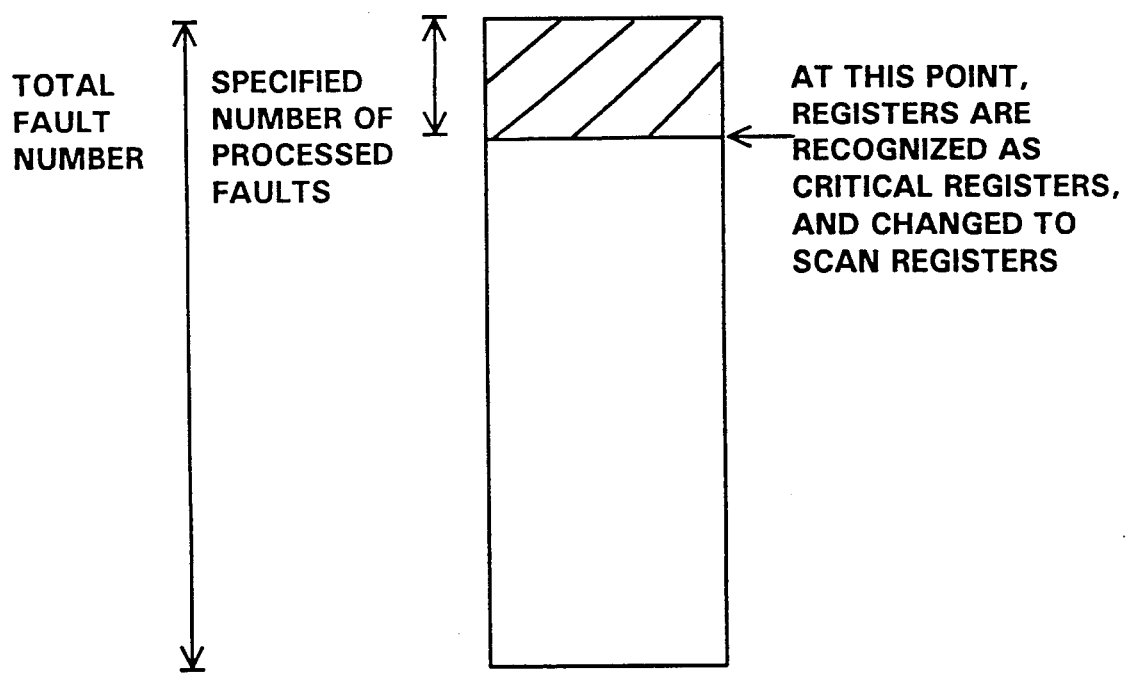
FIG. 8B is a diagram illustrating the timing of recognizing registers as critical registers.
Figure 8C:
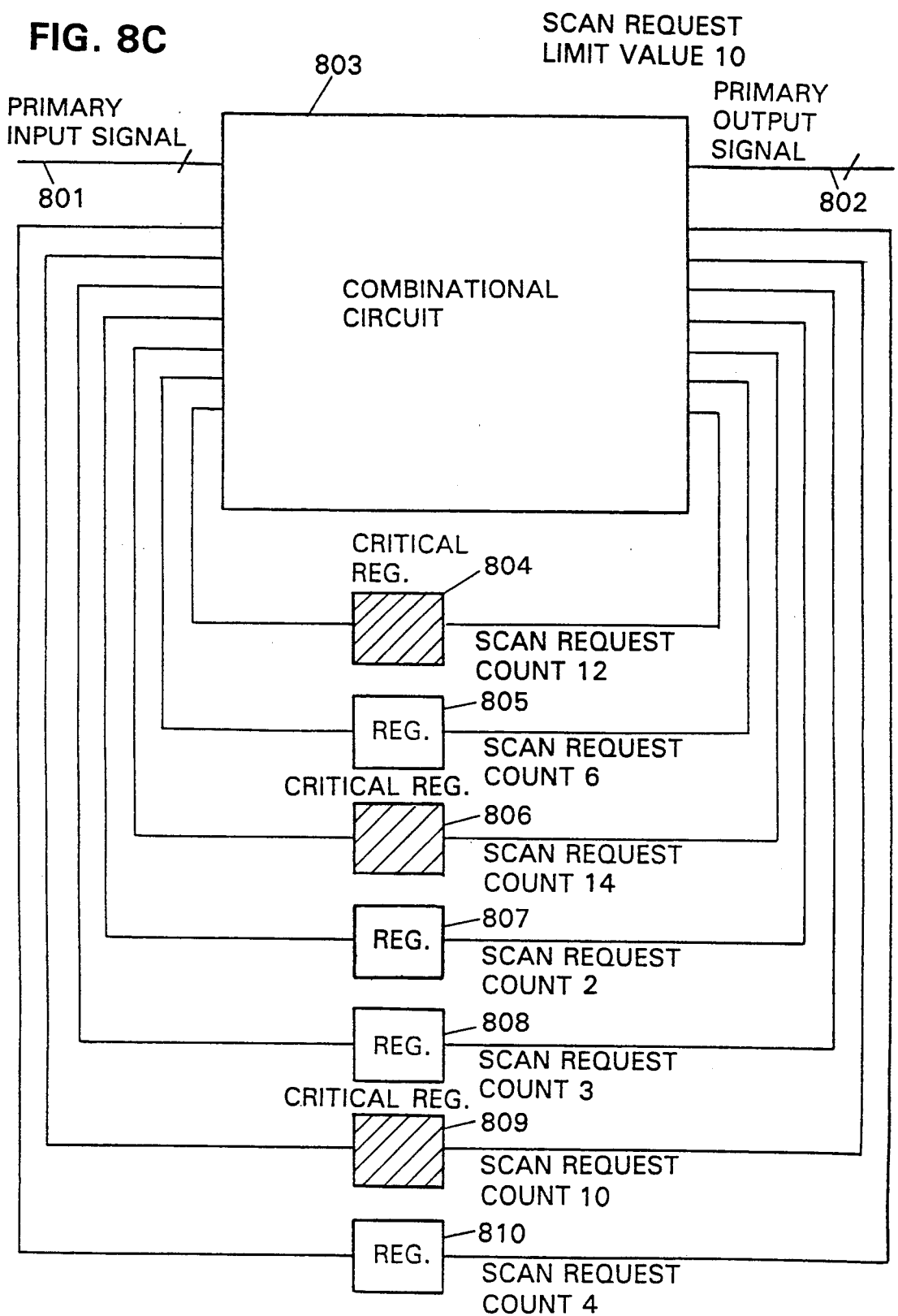
FIG. 8C shows the state of the circuit after registers are recognized as critical registers.
Figure 8D:
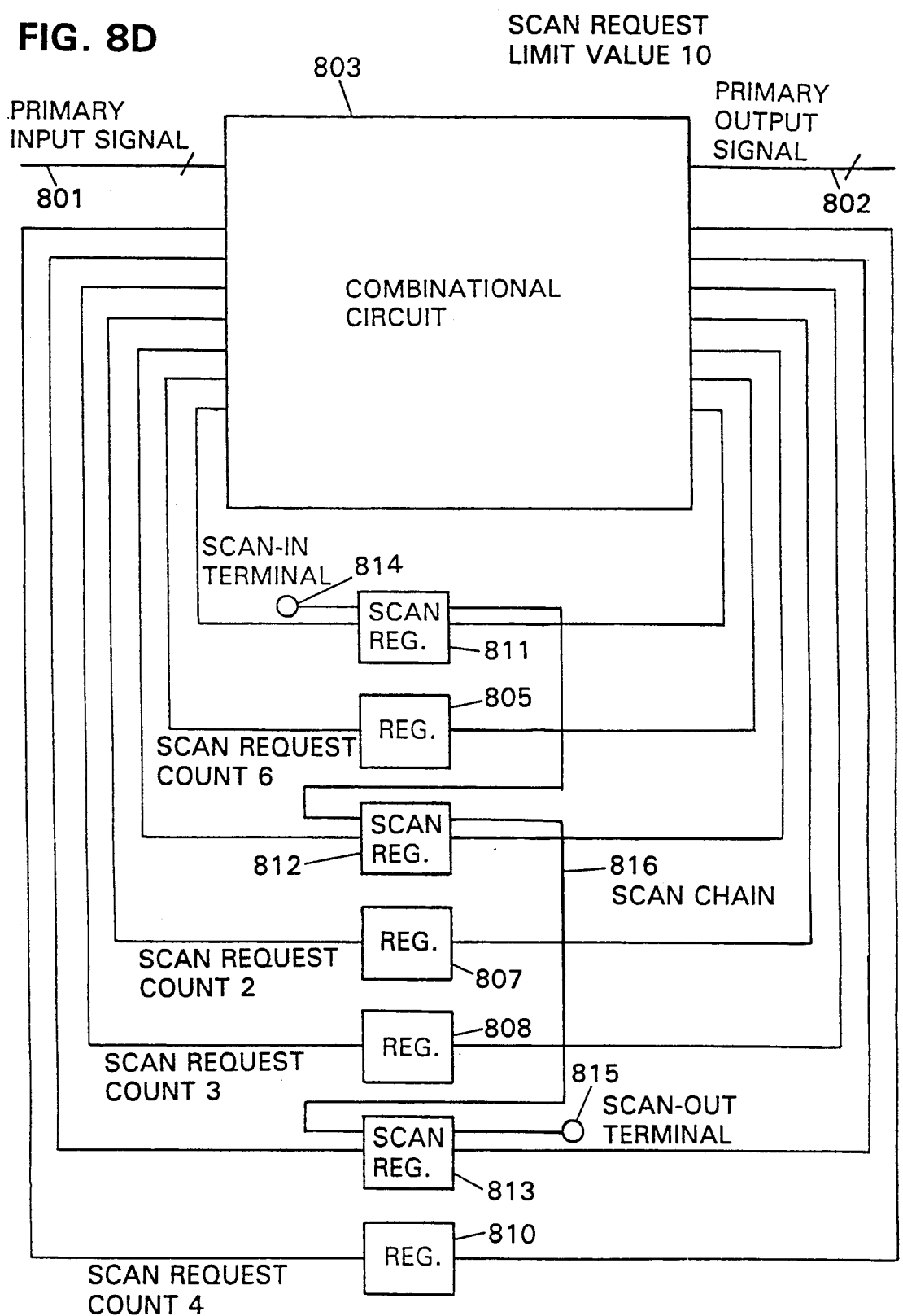
FIG. 8D shows the state of the circuit after registers recognized as critical registers are changed to scan registers.
Figure 9A:
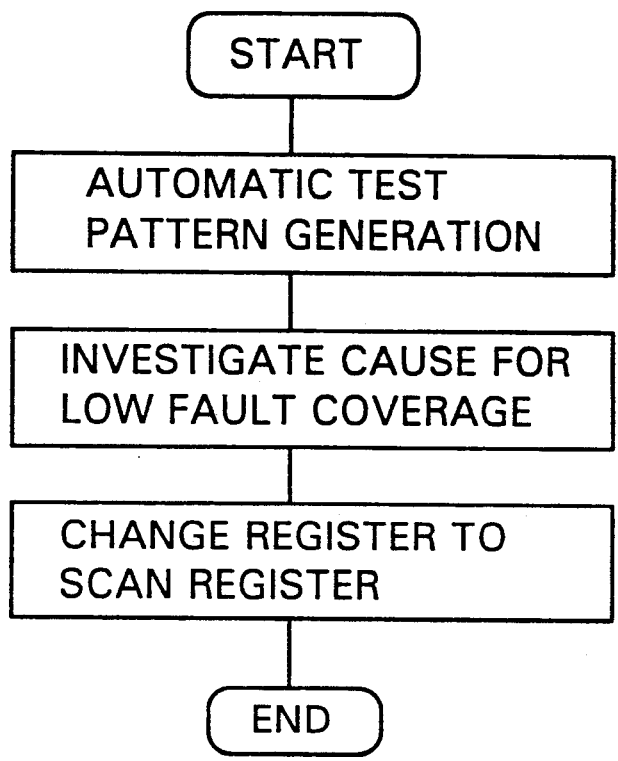
FIGS. 9A and 9B are flowcharts illustrating the operation in the prior art.
Figure 9B:
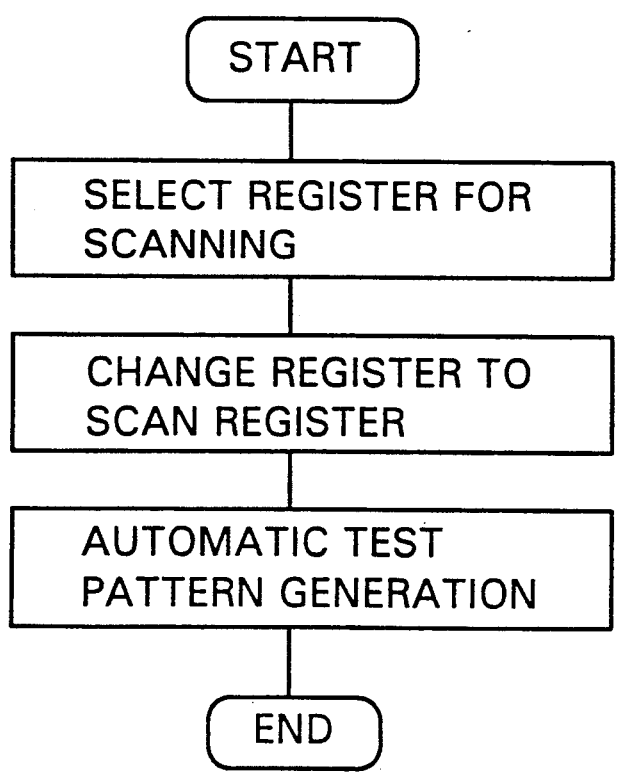

The automatic test pattern generation method and design method for testability shown in the flowchart of FIG. 7 are applied to the circuit shown in FIG. 8A. In FIG. 8A, the controllable points are the primary input signal lines 801, and the observable points are the primary output signal lines 802. The scan request count limit specified in step 701 is 10. That is, registers the scan request count of which equals or exceeds 10 are recognized as critical registers. The state of the circuit becomes as shown in FIG. 8C as a result of applying the automatic test pattern generation method shown in the flowchart of FIG. 7 to the circuit shown in FIG. 8A for faults until replacement with scan registers shown in FIG. 8B. The scan request counts for each of the registers at this time are 12 for the register 804, 6 for the register 805, 14 for the register 806, 2 for the register 807, 3 for the register 808, 10 for the register 809, and 4 for the register 810. The registers 804, 806 and 809 the scan request counts of which exceed the scan request count limit of 10 specified in step 701 are recognized as critical registers in step 711. Then in step 713, the register 804 is changed to the scan register 811, the register 806 with the scan register 812, and the register 809 with the scan register 813, and the scan-in terminal 814 and scan-out terminal 815 are used to form a scan path such as that indicated by the scan chain 816 as shown in FIG. 8D. In FIG. 8D, the controllable points are the primary input signal lines 801 and the scan registers 811, 812 and 813, and the observable points are the primary output signal lines 802 and the scan registers 811, 812 and 813, so as compared to FIG. 8A, automatic test pattern generation is made easier.

As described above, according to this embodiment, questioned registers can be preferentially changed to scan registers as in the first embodiment, and therefore test pattern generation can be speeded up. Since critical registers can be identified after only a few abort faults in circuits demonstrating a high correlation with automatic test pattern generation performed on only a certain selected percentage of all the faults, automatic test pattern generation can be further speeded up. Also, by employing a means for replacing critical registers with scan registers immediately after they are recognized as critical registers, testability is achieved with smaller hardware overhead.

In this embodiment, registers the scan request count of which equals or exceeds the specified count in automatic test pattern generation after the specified number of faults have been processed are recognized as critical registers. Alternatively, the same effect can be obtained by recognizing registers whose rate for the faults processed up to that point exceeds a specified rate as critical registers after specified percentage of all faults have been processed.

As described above, according to the invention, automatic test pattern generation and design for testability can be achieved easily, with little CPU time and with small hardware overhead, and therefore the present invention can be practically very effective.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of performing automatic test pattern generation for a digital sequential circuit including registers, said method comprising the steps of:
   maintaining scan request counts, each of the scan request counts being associated with one of the registers;
   determining undetected faults which exist in said circuit;
   processing at least one of said faults by applying automatic test pattern generation to said circuit to generate a test pattern which detects said fault being processed;
   aborting said processing step when said test pattern is not successfully generated as determined by reference to a predetermined parameter;
   when aborting said processing step, identifying at least one of said registers which allow detection of said fault being processed as a result of being scanned;
   incrementing the scan request counts respectively associated with said identified registers; and
   recognizing as being critical registers said registers respectively having scan request counts which satisfy predetermined criteria.

2. A method according to claim 1, wherein said registers respectively having scan request counts greater than a predetermined number are recognized as critical registers.

3. A method according to claim 1, wherein said registers respectively having scan request counts which represent a predetermined percentage of a total number of said faults determined in said determining step are recognized as critical registers.

4. A method according to claim 1, wherein, when a predetermined number of said faults have been processed, a predetermined number of said registers respectively having the highest scan request counts are recognized as critical registers.

5. A method according to claim 1, wherein, when a predetermined percentage of said faults have been processed, a predetermined number of said registers respectively having the highest scan request counts are recognized as critical registers.

6. A method according to claim 1, wherein, when test patterns to detect a preselected percentage of said faults have not been achieved after a predetermined number of said faults have been processed according to said processing step, a predetermined number of said registers respectively having the highest scan request counts are recognized as critical registers.

7. A method according to claim 1, wherein, when test patterns to detect a preselected percentage of said faults have not been achieved after a predetermined percentage of said faults have been processed according to said processing step, a predetermined number of said registers respectively having the highest scan request counts are recognized as critical registers.

8. A method according to claim 1, wherein, when a predetermined number of said faults have been processed according to said processing step, said registers respectively having scan request counts which are greater than a predetermined value are recognized as critical registers.

9. A method according to claim 1, wherein, when a predetermined percentage of said faults have been processed, said registers respectively having scan request counts which are greater than a predetermined value are recognized as critical registers.

10. A method according to claim 1, wherein, when a predetermined number of said faults have been processed, said registers respectively having scan request counts greater than a predetermined percentage of a predetermined number of said faults which have been processed are recognized as critical registers.

11. A method according to claim 1, wherein, when a predetermined percentage of said faults have been processed, said registers respectively having scan request counts which are greater than a predetermined percentage of a total number of faults which have been processed are recognized as critical registers.

12. A method according to claim 1, wherein said automatic test pattern generation is applied during said processing step while regarding said critical registers as scan registers.

13. A method of designing a digital sequential circuit including registers, said method comprising the steps of:
maintaining scan request counts, each of the scan request counts being associated with one of the registers;
determining undetected faults which exist in said circuit;
processing at least one of said faults by applying automatic test pattern generation to said circuit to generate a test pattern which detects said fault being processed;
aborting said processing step when said test pattern is not successfully generated as determined by reference to a predetermined parameter;
when aborting said processing step, identifying at least one of said registers which allow detection of said fault being processed as a result of being scanned;
preselecting a scan request count limit;
incrementing the scan request counts respectively associated with said identified registers;
recognizing as being critical registers said registers respectively having scan request counts which are respectively greater than said scan request count limit; and
at each time when at least one of said registers is recognized as being a critical register, designing each of said recognized registers to be a register which can be scanned.

14. An apparatus for performing automatic test pattern generation for a digital sequential circuit including registers, said apparatus comprising:
means for maintaining scan request counts, each of the scan request counts being associated with one of the registers;
means for determining undetected faults which exist in said circuit;
means for processing at least one of said faults by applying automatic test pattern generation to said circuit to generate a test pattern which detects said fault being processed;
means for aborting said processing when said test pattern is not successfully generated as determined by reference to a predetermined parameter;
means for, when aborting said processing, identifying at least one of said registers which allow detection of said fault being processed as a result of being scanned;
means for incrementing the scan request counts respectively associated with said identified registers; and
register recognition means for recognizing as being critical registers said registers respectively having scan request counts which satisfy a predetermined criteria.

15. An apparatus according to claim 14, wherein said register recognition means recognizes said registers respectively having scan request counts greater than a preselected number as critical registers.

16. An apparatus according to claim 14, wherein said register recognition means recognizes said registers respectively having scan request counts which represent a preselected percentage of a total number of said faults determined by said determining means as critical registers.

17. An apparatus according to claim 14, wherein, when a predetermined number of said faults have been proposed by said processing means, said register recognition means recognizes a predetermined number of said registers respectively having the highest scan request counts, as critical registers.

18. An apparatus according to claim 14, wherein, when a predetermined percentage of said faults have been processed, said register recognition means recognizes a predetermined number of said registers respectively having the highest scan request counts, as critical registers.

19. An apparatus according to claim 14, wherein, when test patterns to detect a predetermined percentage of said faults have not been achieved after a predetermined number of said faults have been processed by said processing means, said register recognition means recognizes a predetermined number of said registers respectively having the highest scan request counts, as critical registers.

20. An apparatus according to claim 14, wherein, when test patterns to detect a preselected percentage of said faults have not been achieved after a predetermined percentage of said faults have been processed by said processing means, said register recognition means recognizes a predetermined number of said registers respectively having the highest scan request counts, as critical registers.

21. An apparatus according to claim 14, wherein, when a predetermined number of said faults have been processed, said register recognition means recognizes said registers respectively having scan request counts which are greater than a predetermined value, as critical registers.

22. An apparatus according to claim 14, wherein when a predetermined percentage of said faults have been processed, said register recognition means recognizes said registers respectively having scan request counts which are greater than a predetermined value, as critical registers.

23. An apparatus according to claim 14, wherein, when a predetermined number of said faults have been processed, said register recognition means recognizes said registers respectively have scan request counts greater than a predetermined percentage of a predetermined number of said faults which have been processed, as critical registers.

24. An apparatus according to claim 14, wherein, when a predetermined percentage of said faults have been processed, said register recognition means recognizes said registers respectively having scan request counts which are greater than said predetermined percentage of the faults which have been processed, as critical registers.

25. An apparatus according to claim 14, wherein said processing means comprises means for performing said automatic test pattern generation while regarding said critical registers as scan registers.

26. An apparatus for designing a digital sequential circuit including registers, said apparatus comprising:

means for maintaining scan request counts, each of the scan request counts being associated with one of the registers;

means for determining undetected faults which exist in said circuit;

means for processing at least one of said faults by applying automatic test pattern generation to said circuit to generate a test pattern which detects said fault being processed;

means for aborting said processing when said test pattern is not successfully generated as determined by reference to a predetermined parameter;

means for, when aborting said processing, identifying at least one of said registers which allow detection of said fault being processed as a result of being scanned;

count set means for preselecting a scan request count limit;

means for incrementing the scan request counts respectively associated with said identified registers;

register recognition means for recognizing as being critical registers said registers respectively having scan request counts which are greater than said scan request count limit; and circuit reconstruction means for, at each time when at least one of said registers is recognized as being a critical register, designing each of said recognized registers to be a register which can be scanned.

* * * * *